United States Patent [19]

Fukuda

[11] Patent Number: 5,428,648
[45] Date of Patent: Jun. 27, 1995

[54] DIGITAL PLL CIRCUIT HAVING SIGNAL EDGE POSITION MEASUREMENT

[75] Inventor: Shinichi Fukuda, Kanagawa, Japan

[73] Assignee: Sony Corporation, Tokyo, Japan

[21] Appl. No.: 118,591

[22] Filed: Sep. 10, 1993

[30] Foreign Application Priority Data

Sep. 18, 1992 [JP] Japan ................................ 4-250109
Sep. 22, 1992 [JP] Japan ................................ 4-253310

[51] Int. Cl.$^6$ .............................................. H04L 7/00
[52] U.S. Cl. ...................................... 375/371; 375/373
[58] Field of Search ............... 375/110, 118, 119, 120, 375/106; 377/104; 307/511, 269, 590, 601; 331/57; 328/63, 155, 133, 134

[56] References Cited

U.S. PATENT DOCUMENTS

| | | | |
|---|---|---|---|
| 3,878,473 | 4/1975 | Furtney, Jr. .................... | 331/1 A |
| 4,456,890 | 6/1984 | Carickhoff ....................... | 375/120 |
| 4,841,551 | 6/1989 | Avaneas ........................... | 375/120 |
| 4,954,824 | 9/1990 | Yamada et al. .................. | 341/61 |
| 5,023,892 | 6/1991 | Stoica .............................. | 375/118 |
| 5,077,529 | 12/1991 | Ghoshal et al. ................. | 375/118 |
| 5,166,959 | 11/1992 | Chu et al. ........................ | 377/20 |

FOREIGN PATENT DOCUMENTS

| | | |
|---|---|---|
| 342736 | 5/1989 | European Pat. Off. . |
| 370528 | 11/1989 | European Pat. Off. . |
| 0467712 | 1/1992 | European Pat. Off. . |
| 0547292 | 6/1993 | European Pat. Off. . |
| 2238922 | 12/1989 | United Kingdom . |

OTHER PUBLICATIONS

Patent Abstracts of Japan, vol. 13, No. 128 corres. to JP-1,019,826 (Fukuda).
Patent Abstracts of Japan, vol. 13, No. 123, corres. to JP-63-292,825 (Fukuda).
The article appearing in Electronic Components and Applications, vol. 9, No. 2, 1989 (Rosink).
The article appearing in International Symposium on Circuits and Systems, vol. 4, May 1990 (Kajiwara et al.).

Primary Examiner—Stephen Chin
Assistant Examiner—Tesfaldet Bocure
Attorney, Agent, or Firm—Jay H. Maioli

[57] ABSTRACT

A ring oscillator has its inverter states in respective inner stages change at a time unit longer than a period of a master clock MCK and is oscillated at a period longer than the period of the master clock MCK. The inverter states of the respective stages of the ring oscillator are captured by a flipflop circuit and a value indicating each of these states is subtracted by a subtractor from numerical figures indicating the inverter states in the respective stages of the ring oscillator as captured at the timing of the master clock MCK by other flipflop circuits. The difference is output as a signal indicating the position of the input signal edge.

9 Claims, 23 Drawing Sheets

FIG.8

DIGITAL PLL CIRCUIT HAVING SIGNAL EDGE POSITION MEASUREMENT

BACKGROUND OF THE INVENTION

This invention relates to a digital phase-locked loop (PLL) circuit and, more particularly, to a digital PLL circuit in which an edge position of the input signal waveform is detected and the PLL operation is performed in a digital fashion based on the detected edge position.

In general, the PLL circuit is a phase synchronizing circuit in which the phase of an input signal follows the phase of a reference signal. An analog PLL circuit is made up of a phase comparator, a low-pass filter and a voltage-control led oscillator. Recently, there has been proposed a digital PLL circuit in which the operation of the analog PLL circuit is performed in a digital fashion.

With the digital PLL circuit, the phase difference between the PLL output signal and the input signal is measured using a master clock. That is, the phase difference between the edge of the input signal and the output clock of the PLL circuit is found by the master clock. Based on such phase difference, the output clock is controlled so as to be in phase with the input clock. A precision at least a factor of two higher than the bit clock of the input signal is required on the master clock. As the clock frequency of the input signal is increased, it becomes increasingly difficult to obtain a master clock frequency so as to be higher by at least a factor of two because the operating clock frequency cannot be increased without limitations. Thus a digital PLL circuit which facilitates phase difference detection without employing a higher frequency of the master clock is desirable. In a digital PLL circuit, the input signals are sampled with the master clocks. The timing of the input signal edge, produced by such sampling, contains an error dependent on the master clocks. Therefore, for inhibiting data errors in the PLL circuit, it is necessary to sample the input signal with a master clock having as short a period as possible to capture the timing of the input signal edge accurately. Recently, despite limitations imposed on the master clock frequency because of semiconductor process constraints a PLL circuit has been desired in which a satisfactory error rate may be assured even if the ratio Of the master clock frequency/PLL output clock frequency is on the order of 2 or higher.

The present inventors have disclosed in Application SHO 62-127168 (JP Patent Publication KOKAI No. 63-292825) a technique in which the time duration of a number N of output clock pulses of PLL circuit is detected using a master clock having a predetermined frequency and the time duration is multiplied by 1/N to find the period of the PLL clock with a degree of precision equal to N times the master clock.

According to the teaching of the Application No. SHO 62-175732 (JP Patent KOKAI Publication No. 64-19826), the time duration of N/K number of output clock pulses of the PLL circuit is sequentially detected and the K number of the sequentially detected time durations is multiplied by 1/N to find the output clock period. By these techniques, the digital PLL is formed using master clocks of a lower frequency.

Recently, the output PLL clock frequency (reproducing clock frequency) has been increased in keeping up with higher system performance and a demand for master clock frequency to PLL output clock frequency ratio on the order of 2 to 3. Since the error rate tends to be increased with the above techniques, further improvement is desired.

SUMMARY OF THE INVENTION

In view of the above-described status of the art, it is an object of the present invention to provide a digital PLL circuit in which the master clock frequency on the order of two to three times the input signal clock frequency may be employed.

It is another object of the present invention to provide a digital PLL circuit in which a satisfactory error rate may be assured even when the ratio of the master clock frequency to the reproducing clock frequency is on the order of 1 or higher.

It is yet another object of the present invention to provide a circuit for measuring the timing of an input signal edge which may be desirably applied to the present digital PLL circuit.

According to the present invention, there is provided an input signal edge time measurement circuit comprising a ring oscillator having an even number of inverters connected in a ring, means for detecting an edge of input signals, first latch means for capturing states of various stages of the ring oscillator at the timing of a detected edge of an input signal, second latch means for capturing the states of the respective stages of the ring oscillator at the timing of a master clock, and edge position calculating means for comparing the states of the respective stages of the ring oscillator captured by the first latch means and the states of the respective stages of the ring oscillator captured by the second latch means and outputting a difference between these states as an edge position detection signal.

The input signal edge time measurement circuit according to the present invention comprises third latch means for capturing an output of the first latch means at a rise timing of the master clock and a fourth latch means for capturing an output of the first latch means at a decay timing of the master clock. An output of the third latch means and an output of the fourth latch means are selected when the edge of the input signal is in a high level domain of the master clock and in a low level domain of the master clock, respectively, and the output thus selected is compared to an output of the second latch means. The ring oscillator comprises a number of inverters having variable delay time durations. The delay time is preferably selected depending on the ratio of the master clock period to the period of oscillation of the ring oscillator.

The digital PLL circuit according to the present invention comprises, in addition to the above-mentioned input signal edge timing measurement circuit, a unit for sampling the input signal by master clocks for detecting the possible presence of the input signal edge based on the master clocks for outputting an edge detection signal, a reproducing clock generating unit for outputting reproducing clocks based on phase error data and reproducing clock period data, a phase error detection unit for finding phase error data between the reproducing clocks and the input signal edge based on the edge detection signal to transmit the phase error data to the reproducing clock generating unit, and a reproducing clock period detection unit for detecting period data of reproducing clocks from the reproducing clock generating unit for transmitting the detected period data to the reproducing clock generating unit.

Since the states of the various stages of the ring oscillator are changed with the time Tun obtained by dividing the oscillation period of the ring oscillator by the number of stages of the ring oscillator as a unit, the difference in capturing timing by the first and second latch units may be represented by he measurement time unit Tun. That is, the input signal edge for each master clock period may be represented highly accurately by the measurement time unit τun.

The phase error between the reproducing clock and the input signal edge may be found with the accuracy of the measurement time unit Tun based on the input edge position represented by he measurement time unit Tun so that optimum PLL operation may be maintained even although the master clock period approaches the reproducing clock period.

According to the present period, there is also provided a digital PLL circuit comprising a first shift register to which the edge detection signal is entered, a window circuit for limiting an output of the first shift register to a number of bits corresponding to one period of a reproducing clock, a first latch circuit for capturing bits passed through the window circuit, edge bit position detection means for detecting the possible presence of the input edge and a corresponding bit position thereof from the value captured by said first latch circuit, a second shift register to which the edge position signal is entered, a selector for selecting an output of said selector by said edge detection signal, a second latch circuit for capturing an output of the selector, and means for subtracting a value corresponding to a zero phase error edge position from a combined output of an output of the edge bit position detection means and an output of the second latch circuit. The window circuit comprises a window generating circuit for calculating the window width.

The digital PLL circuit according to the present invention comprises a loop gain controlling unit for controlling a loop gain which is a rate of changing the phase of the reproducing clock by the detected phase error, and a phase lock decision unit for deciding whether or not the PLL is phase locked. The loop gain controlling circuit is controlled by a signal from the phase lock decision unit.

BRIEF DESCRIPTION OF THE DRAWINGS

FIG. 8 shows specific values of signals indicating the edge positions.

DESCRIPTION OF THE PREFERRED EMBODIMENTS

Figure 1:
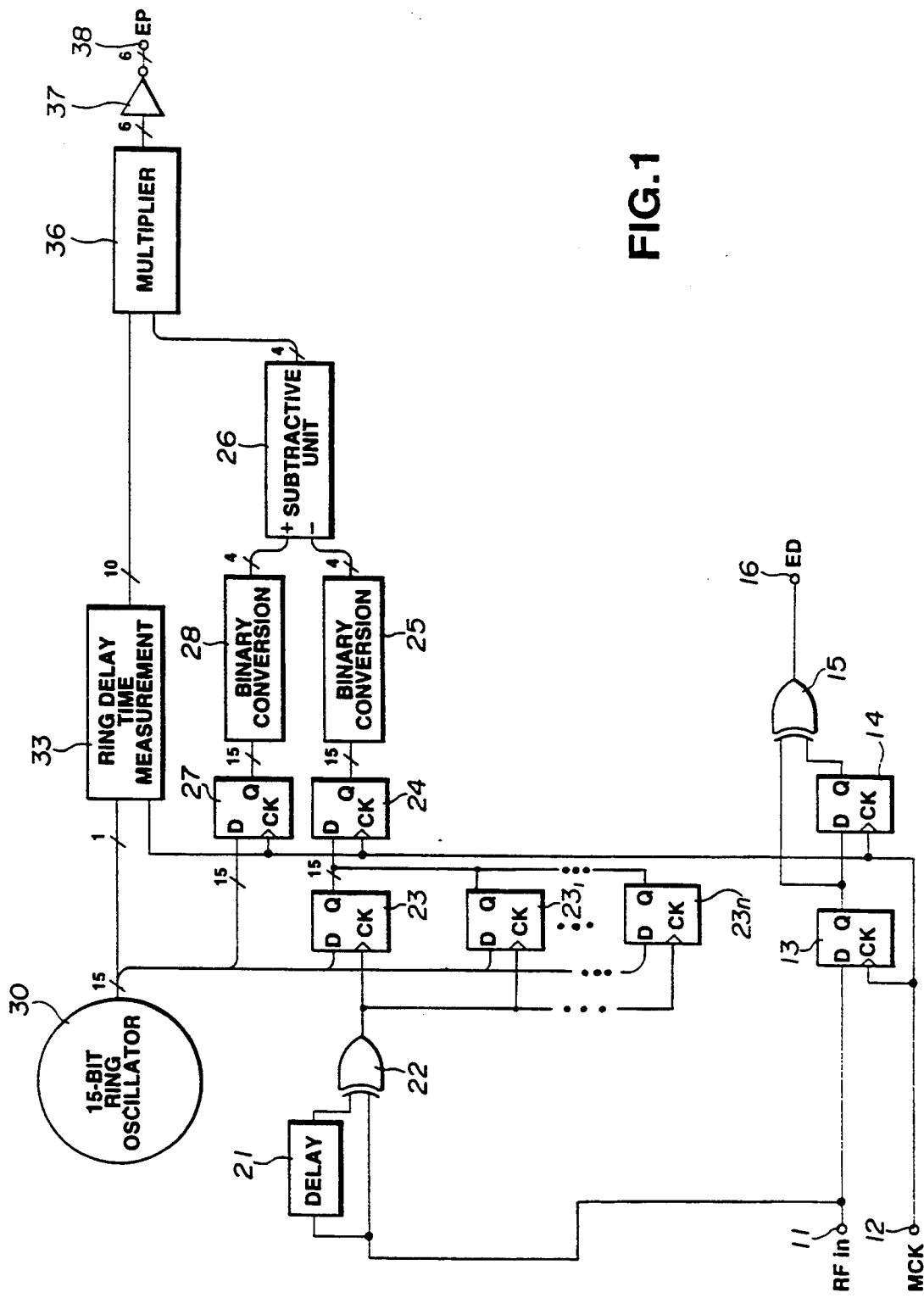
FIG. 1 is a schematic block circuit diagram showing an arrangement of a circuit for measuring the input signal edge timing in a digital PLL circuit according to the present invention.

FIG. 1 shows, in a block circuit diagram, arrangement of an input signal edge measurement circuit employed in the digital PLL circuit according to the present invention.

In FIG. 1, an RF (high frequency) signal RF in, clocks of which are to be reproduced, is supplied to an input terminal 11. A master clock signal MCK, which is to be a reference signal, is supplied to an input terminal 12. The RF input signal RFin is supplied to a data input terminal D of a flip-flop 13, to which the master clock MCK is entered as a clock, so that the input signal RF in is captured at the timing of the master clock. An output of the flip-flop 13 and a corresponding signal delayed by one master clock period by the flip-flop 14 are supplied to an exclusive OR circuit 15 for edge detection. A detection signal ED, timed to the master clock signal MCK, indicating the presence or absence of the input edge, is outputted at an output terminal 16.

The RF input terminal RF in from input terminal 11 is also supplied to a delay element 21 having a delay time sufficiently shorter than the master clock period TMC and an exclusive-OR circuit 22 for edge detection before being supplied to a clock input terminal of a flip-flop circuit 23. The flip-flop circuit 23 is composed of an n number of flip-flops connected in parallel. The number n corresponds to the number of stages n of a ring oscillator 30 which is an odd number, such as 10. That is, the flip-flop circuit 23, composed of these n flip-flops, plays the role of capturing the states of the stages of the n-bit ring oscillator 30, consisting of a circular array of n stages of inverters, into each of the data input terminals D thereof depending on the edge detection outputs of the RF in input signal. The flip-flop circuit 23 consists of 15 flip-flops connected in parallel for capturing the states of the 15 stages of the inverters making up the ring oscillator 30.

Figure 2:
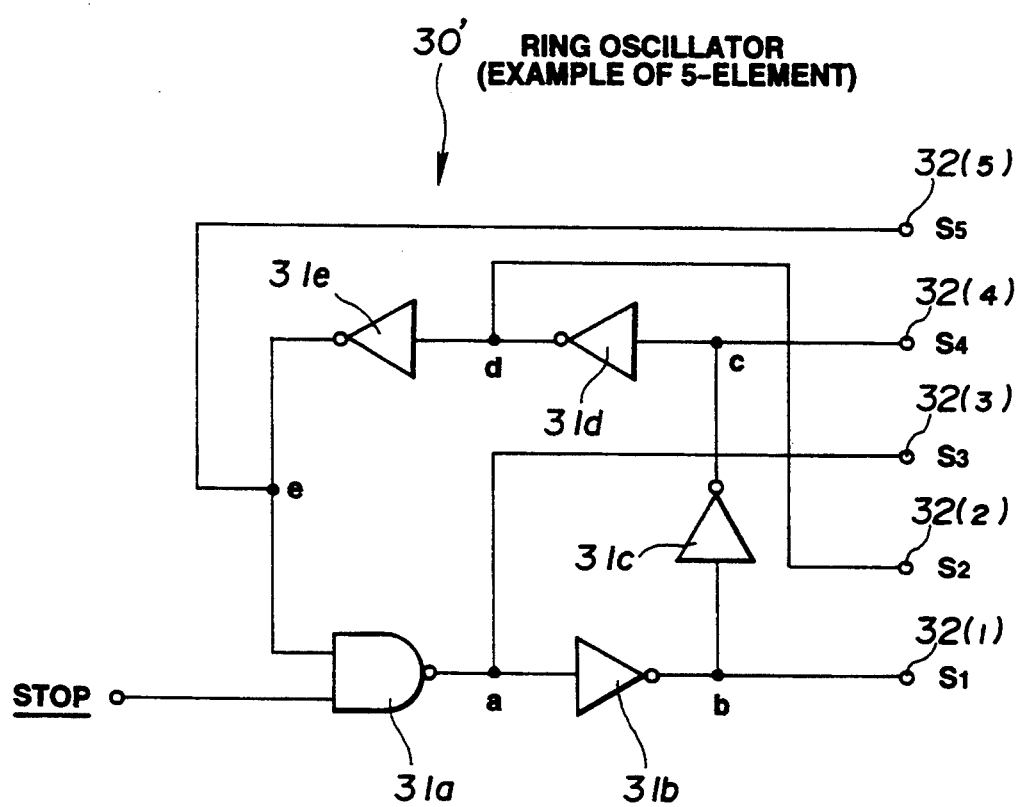
FIG. 2 is a circuit diagram showing an arrangement of a ring oscillator employed in the PLL circuit shown in FIG. 1.

An exemplary arrangement of the ring oscillator 30 is explained by referring to FIG. 2. In the arrangement of FIG. 2, the number n is set to 5 for simplicity of the explanation.

Referring to FIG. 2, five-stage or five-bit ring oscillator 30' comprises five inverters 31a, 31b, 31c, 31d and 31e connected in a ring. Since number of the inverters is the odd number, there exists an inverter which remains in the same polarity "H" even though the input is changed to "H".

If an output of the inverter is changed to "L" after a delay proper to the inverter, the state is transferred to the next inverter. This assures stable oscillation. In the arrangement shown in FIG. 2, a two-input NAND gate is employed as element 31a for starting and stopping the oscillation of the ring oscillator 30'. The NAND gate 31a has its one terminal supplied with an output signal from the inverter 31e, while having its other terminal supplied with a control signal for controlling the oscillation.

Figure 3:
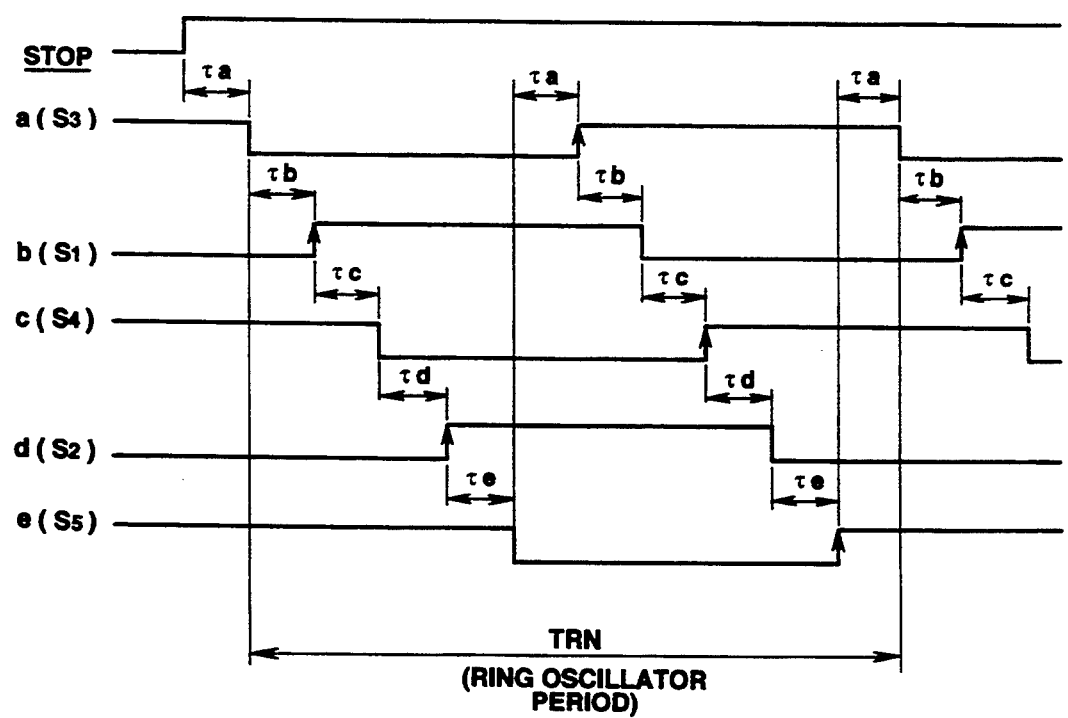
FIG. 3 is a timing chart for illustrating the operation of the ring oscillator shown in FIG. 2.

FIG. 3 shows signal waveforms of various parts of the ring oscillator 30' shown in FIG. 2. Thus the control signal STOP and output signals a, b, c, d and e of the inverters 31a, 31b, 31c, 31d and 31e are shown. The delay times of these inverters 31a, 31b, 31c, 31d and 31e are indicated as $\tau a$, $\tau b$, $\tau c$, $\tau d$ and $\tau e$, respectively. Tf the control signal STOP rises, the inverted output signal a from inverter 31a decays after lapse of time $\tau a$. The signal inversion occurs sequentially by the subsequent inverters 31b to 31e so that an output signal waveform as shown at (b) to (e) in FIG. 3 is produced. The period TRN of these output signals depends on the propagation time of the five inverters of the ring oscillator 30'.

$$TRN = 2(\tau a + \tau b + \tau c + \tau d + \tau e)$$

If the delay times $\tau a$, $\tau b$, $\tau c$, $\tau d$ and $\tau e$ of the inverters are equal to one another, such that $\tau a = \tau b = \tau c = \tau d = \tau e = \tau 0$, then $$TRN10\tau 0$$

The delay per inverter and the number of stages of the inverters are set so that the period of oscillation TRN of the ring oscillator is longer than the period TMC of the master clock MCK. It is because the timing can not be determined if the same state of the ring oscillator appears more than once during one period of the master clock MCK.

If attention is drawn to the rise of the output signals a to e in FIG. 3, the signals b, d, a, c and e appear in this order. These signals b, d, , c and e are outputted as oscillator outputs S1, S2, S3, S4 and S5 at the output terminals 32(1), 32(2), 32(3), 32(4) and 32(5), respectively. It is these output signals A1 to S5 that are supplied to the respective flip-flops making up the flip-flop circuit shown in FIG. 1. In the embodiment of FIG. 1, a 15-stage ring oscillator 30, made up of 15 inverters, is employed, and the output signals S1 to S15 of the inverters are supplied to data input terminals D of the 15 flip-flops making up the ring oscillator 30. In the flip-flop circuit 23, the output signals S1 to S15 of the ring oscillator 30 are captured by the flip-flops at the timing of the RF input signal RF in for performing fine time measurements as later explained, above all , detection of input signal edges with respect to the rising edges of the master clock MCK. If attention is drawn only to the signal rise as mentioned above, for the states of the inverters of the ring oscillator 30, the unit time of measurement $\tau un$, which is to be a unit for measuring the input signal edge position as later explained, is twice the delay time $\tau 0$ of the inverter, that is, $\tau un = 2\tau 0$.

Figure 4:
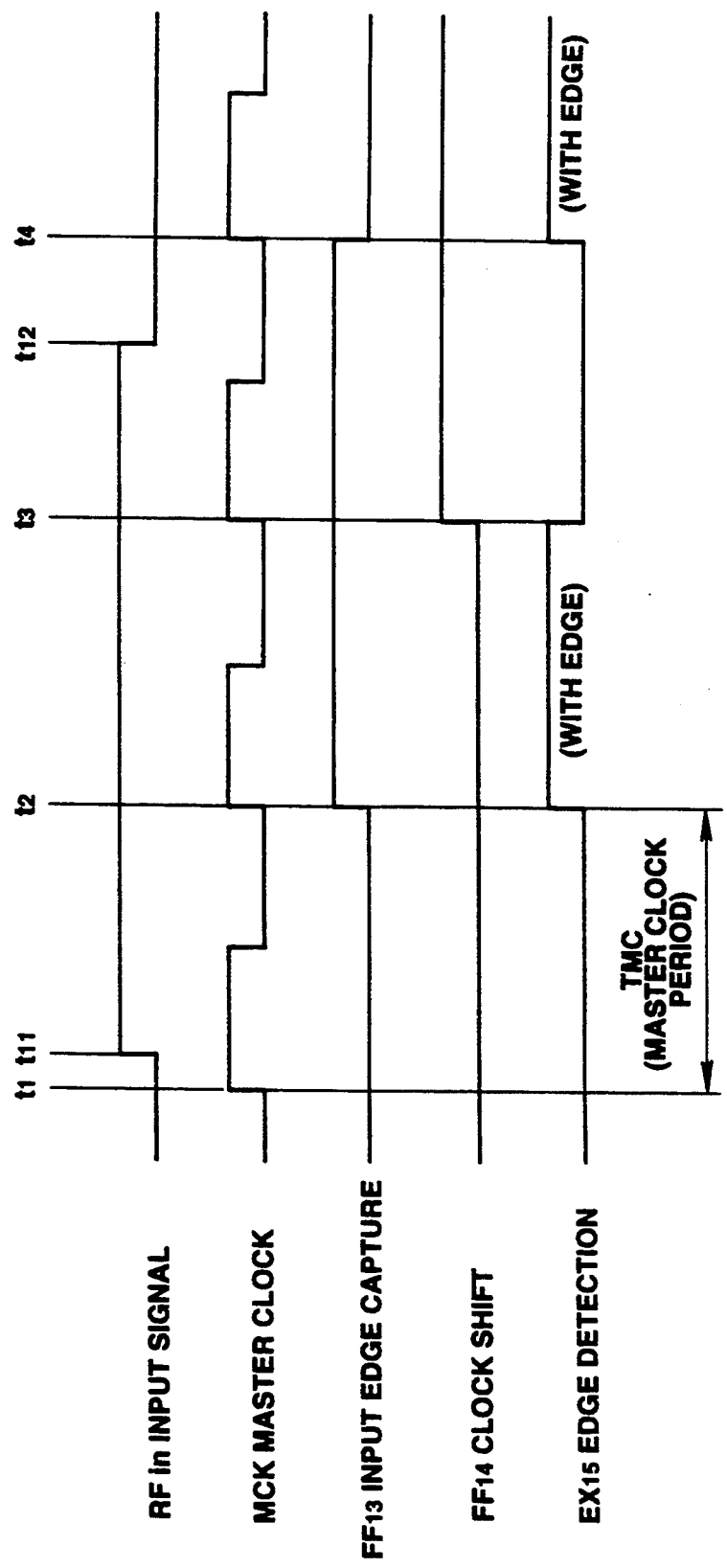
FIG. 4 is a timing chart for illustrating the operation of edge detection of the input signal.

FIG. 4 shows a signal waveform for illustrating the operation of input edge detection for each master clock by the flip-flops 3 and 14 and the exclusive OR 15 shown in FIG. 1.

Referring to FIG. 4, flip-flop 13 captures the RF input signal RF in from the input terminal 11 of FIG. 1 at the rise timing of the master clock signal MCK to output a signal FF13. The flip-flop 14 delays the output signal FF13 by a delay time equal to a master clock period TMC to output a signal FF14. The exclusive OR 15 takes an exclusive OR of these signals FF13 and FF14 to supply a signal EXit at an output terminal 16. The "H" state of the output signal EXIT represents the state of edge detection at the directly-previous clock period. This enables detection of the possible presence of the input signal edge for each master clock.

Referring to the signal waveform shown in FIG. 5, the timing measuring operation for the input signal edge by the ring oscillator 30 made up of inverters shown in FIG. 1, that is the operation of measuring the delicate edge position within the master clock period TMC, is hereinafter explained.

Figure 5:
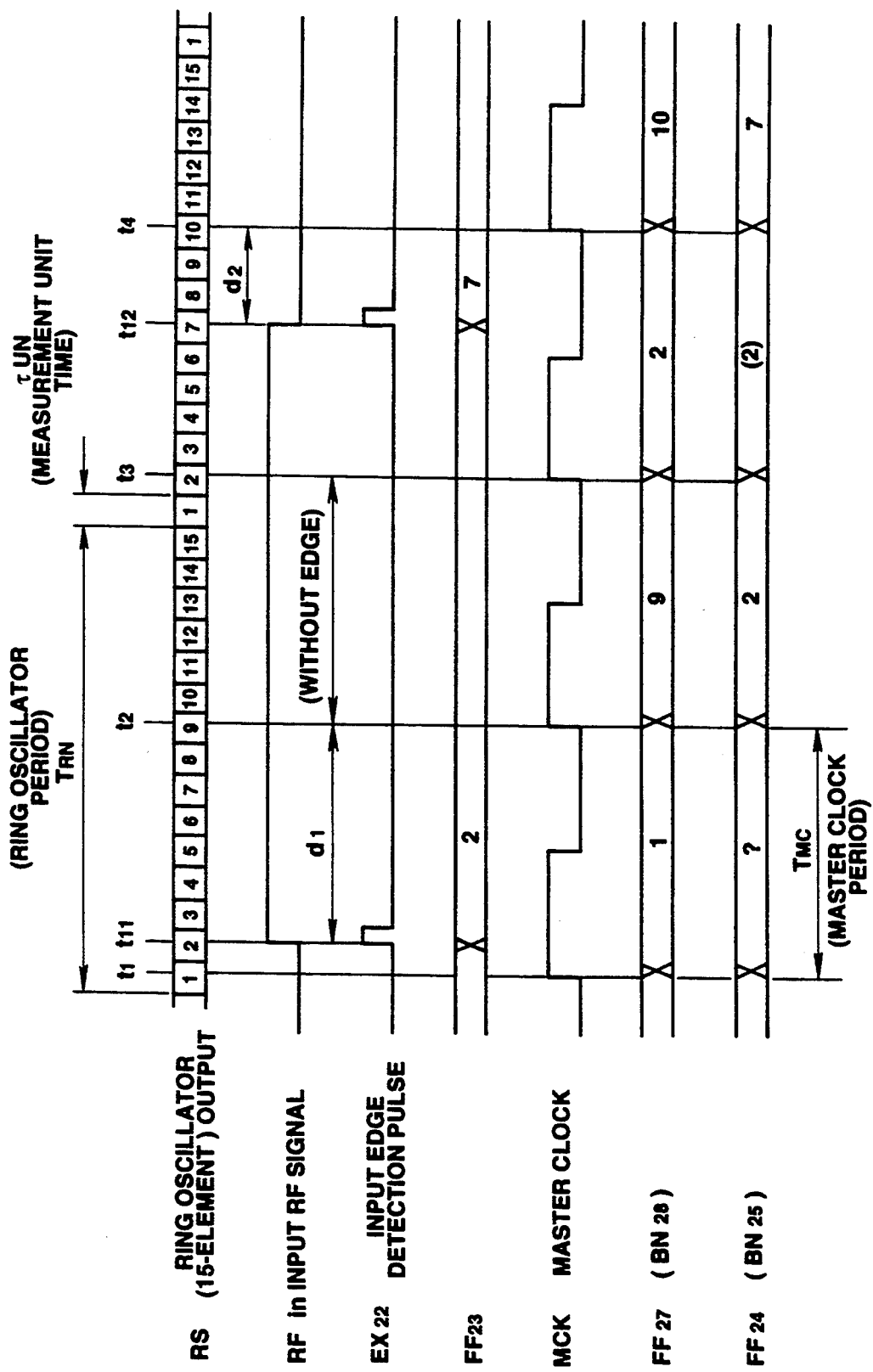
FIG. 5 is a timing chart for illustrating the operation of edge position detection of the input signal.

Referring to FIG. 5, the ring oscillator 30, made up of the inverters, is adapted for measuring the time with the unit time $\tau un$, finer than the master clock MCK, as shown by an output signal RS. The time difference d between the rising edge of the master clock MCK and the rising OF falling edge of the RF input signal RF in is measured by the ring oscillator output signal RS based on the unit time $\tau un$.

Specifically, the master clocks MCK are supplied from the input terminal 1 to the flip-flop circuit 27 made up of a number of flip-flops equal to the number of inverters of the ring oscillator 30 SO as to be captured by these flip-flops as clocks. The states of the inverters of the ring oscillator 30 are captured by the flip-flops at the timings of the rising edges of the master clocks MCK. An example of an output of the flip-flop circuit 27 is shown in FIG. 5 as a signal RF27.

Edge detection of the RF input signal RF in from the input terminal 11 is made by the delay element 21 and the exclusive OR circuit 22 to produce an edge detection signal EX22. The edge detection signal EX22 is supplied to a clock input terminal of each flip-flop of the flip-flop circuit 23 SO that the states of the inverters of the ring oscillator 30 are captured by the flip-flops at the timing of the edges of the input signal. An output signal FF23 of each flip-flop of the flip-flop circuit 23 is supplied to each flip-flop of the next-stage flip-flop circuit 24. Since the master clock MCK is supplied as clock to the flip-flop circuit 24, the signal FF23 is re-captured at the timing of the rising edge of the master clock MCK to produce an output signal FF24 from the flip-flop circuit 24.

The output signal RS of the ring oscillator shown in FIG. 5 is indicated by the numbers 1 to 15 corresponding to the 15 states of the ring oscillator 30 made up of the 15 inverters. That is, these 15 states correspond to the states (15 states) obtained by dividing the period of oscillation of the ring oscillator TRN by the number of the inverters. The output signals FF23, FF24 and FF27 of each flip-flop circuit are indicated by the figures corresponding to the inner stages of the ring oscillator 30. For example, the state of the ring oscillator output RS at the rising timing t1 of the master clock MCK in FIG. 5 is "1". This state is captured by the 15 flip-flops of the flip-flop circuit 27. Consequently, the state of the output of the flip-flop circuit 27 since this timing t1 becomes "1".

As a concrete example of the operation of measuring the fine position within the master clock period TMC in FIG. 5, the operation of measuring a time period d1 since the rising edge timing t11 of the input signal RF in until the rising timing t2 of the next master clock MCK is explained.

At the edge timing t11 of the input signal RF in, the stage of the ring oscillator output RS is "2" This state "2" is captured by the flip-flop circuit 23 so that an output becomes "2". This output "2" of the flip-flop circuit 23 is captured by the flip-flop circuit 24 at the timing t2 so as to be transmitted to a binary conversion circuit 25. The state of the ring oscillator output RS at timing t2 is "9". This state "9" is captured by flip-flop circuit 27 so that an output "9" is transmitted to binary conversion circuit 28. These outputs of flip-flop circuits 27, 24 represent output states of the 15 flip-flops. These states are converted by the binary conversion circuits 28, 25 into numerical data BN28, BN25, respectively. In the example of FIG. 5, the numerical data "9" and "2" are transmitted to a subtractive unit 26. The concrete construction of the binary conversion circuits 28, 25 is explained subsequently by referring to FIG. 6.

The value of the output of the subtractive unit 26 is equivalent to the time duration d1, indicating the fine position of the input signal edge in terms of the unit time run. The time duration since time point t2 until the rising time t3 of the next master clock MCK is "7" (9–2).

That is, the time duration d1 since the input edge time t11 until the rising time of the master clock t2 is measured to be substantially equal to the delay time of 7 τun ( 14τO) corresponding to seven time units of measurement τun (=2 τO) of the ring oscillator 30.

In a similar manner, the time duration d2 since the falling edge t12 of the input signal RF in until the next rising time t4 of the master clock MCK is found as an output value "3" (=10–7) from the subtractive unit 26 which effects subtraction of the output state of the ring oscillator output RS at timing t12 of "7" from the output state of the output RS at timing t4 of "10".

Figure 6:
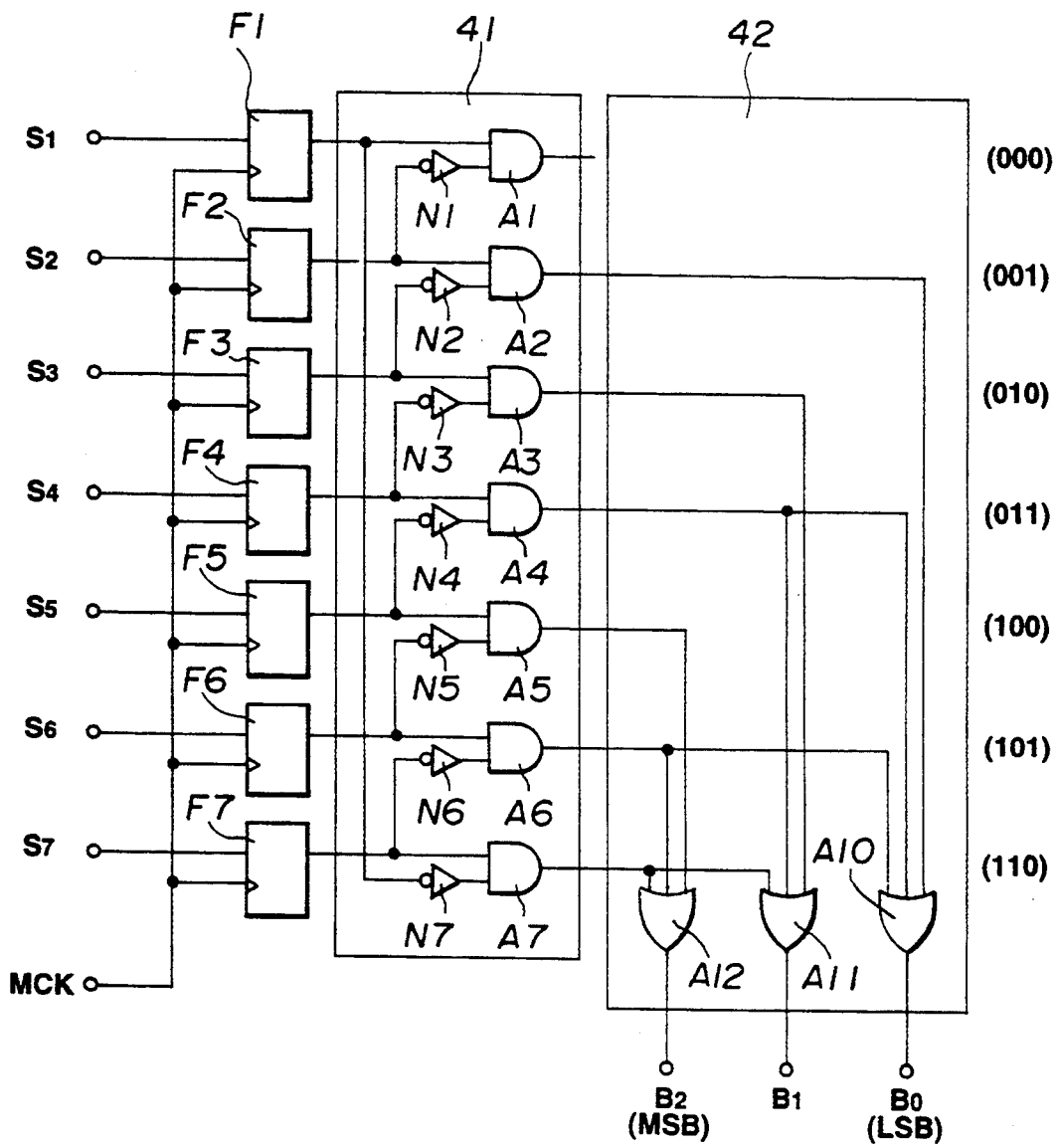
FIG. 6 is a circuit diagram of an exemplary binary translating circuit.

The concrete construction of the binary conversion circuits 28, 25 is explained by referring to FIG. 6. In this figure, construction in which seven states outputted from a ring oscillator made up of seven inverters are converted by binary conversion is shown for simplicity.

Referring to FIG. 6, seven flip-flops F1 to F7 correspond to the flip-flop circuits 24 OF 27. The states of the input signals S1 to S7 are captured by these flip-flops F1 to F7 at the timings of rising edges of the master clock MCK.

Outputs of the flip-flops F1 to F7 are transmitted to earliest signal detection circuit 41 in which a signal which has just risen is detected and set to be "1", with the remaining signals being "0". Since the signals 1 to 7 are arrayed chronologically in the rising order, if a signal $S_k$ is "H" and the next signal $S_{k+1}$ is "L", the signal $S_k$ is the above-mentioned earliest signal. The value of k is 1 to 7 and k +1 : 1 if k 7. For finding the condition that a given signal $S_k$ is "H" and the next signal $S_{k+1}$ is "L", the earliest signal detection circuit 41 is made up of inverters N1 to N7 and AND gates A1 to A7.

As for outputs of the earliest signal detection circuit 41, only one output becomes "H" ("1") for the states of the signals S1 to S7, with the remaining outputs being all "L" ("0").

For expressing these outputs in a binary form, a 7-3 encoder 42 made up of OR gates A10 to A12 is employed.

Outputs of the second, fourth and sixth AND gates A2, A4 and A6 of the earliest signal detection circuit 41 are supplied to an OR gate A10 on the side of the least significant bit $B_0$. Outputs of the third, fourth and seventh AND gates A3, A4 and A7 of the earliest signal detection circuit 41 are supplied to an OR gate A11, while outputs of the fifth, sixth and seventh AND gates A5, A6 and A7 of the earliest signal detection circuit 41 are supplied to an OR gate A12 on the side of the most significant bit $B_2$. By such arrangement, 7-line inputs are converted into 3-bit binary code data. Heretofore, when the output of the AND gate A1 of the earliest signal detection circuit 41 becomes "1", the 3-bit output of the 7-3 encoder becomes "000". As the outputs of the AND gates sequentially become "1", the 3-bit output is changed sequentially into "001" to "110".

In this manner, the states of outputs of the flip-flops 27, 24 shown in FIG. 1 are converted by the binary conversion circuits 28, 25 into respective binary values which are transmitted to the subtractive unit 26 where the output of tile binary conversion circuit 25 is subtracted from the output of the binary conversion circuit 28. An output of the subtractive unit 26 represents the time which elapses since the edge of the input signal RF in until rise Of the next master clock MCK, that is the above-mentioned time durations d1 or d2, represented by measurement time units τun. This subtraction output is supplied to a multiplier 36.

The multiplier 36 multiplies the subtraction output by the measurement unit time Fun based on the states of the inverters of the ring oscillator 30 to find the fine input edge position time durations d1 and d2. The fine position time duration is represented by numerical figures based on the master clock period TMC as a reference.

In the present embodiment, a period TRN of the operation of the ring oscillator 30 from a ring delay time measurement circuit 33 is transmitted to multiplier 36. The numerical figure of the multiplication output is converted, by state inversion by inverter 37, into the time duration which elapses since the input edge time until the rising edge of the immediately preceding master clock MCK, such as TMC - d1 OF TMC - d2. This time duration signal is outputted at an output terminal 38 as an edge position signal EP. For example, if the edge position signal EP is a 6-bit signal, it represents the time since the rising edge of the master clock MCK until the rising edge of the next master clock by a binary fractional number (0.)000000Ω(0.)111111, with the master clock period TMC being 1. In effect, the foremost "0" of the integer part is not employed.

With the above-described input signal edge timing measurement circuit, an output of the ring oscillator 30, made up of an odd number of inverters coupled to one another in a ring, is captured by the flip-flop circuit 23 as a first latch means at an edge detection timing of the input signal RF in. It is also captured by the flip-flop circuit 27 as a second latch means at the timing of the master clock MCK. The difference between the states of these outputs captured by the first and second latch means is represented by time and taken out as an edge position signal to enable the input edge position or edge timing in terms of the measurement time units Tun which is the time duration of change of states of the ring oscillator 30, that is the period of oscillation of the ring oscillator TRN divided by the number of inverters or inverter stages. This assures high-precision measurement of the input signals.

By applying the input signal edge timing measurement circuit to the digital PLL circuit, satisfactory PLL operation may be achieved without regard to the master clock frequency even with the frequency close to the playback clock frequency. The digital PLL circuit may be provided in which an error rate is not deteriorated because the edge timing is not affected in accuracy despite a lower master clock frequency.

Figure 7:
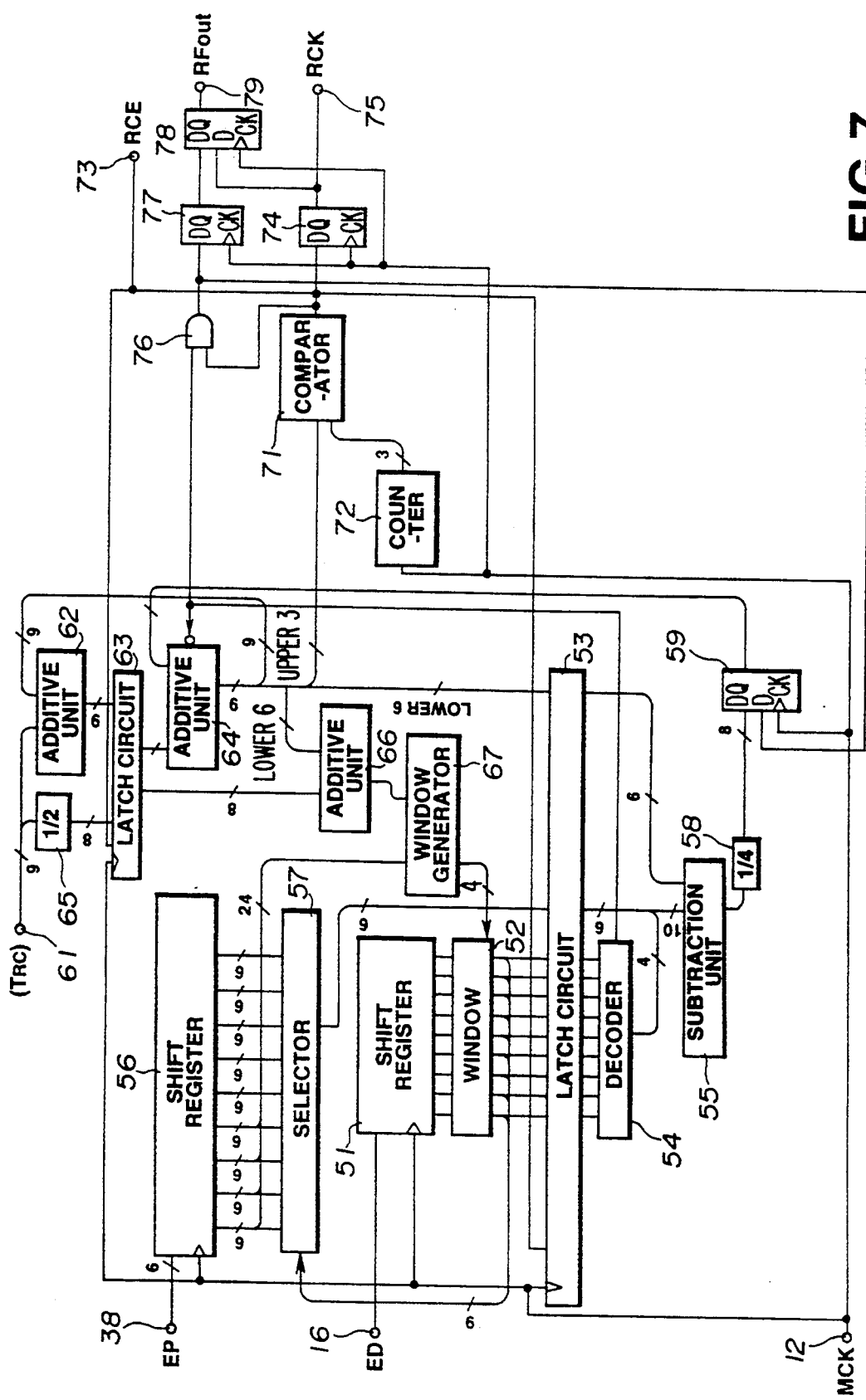
FIG. 7 is a schematic block circuit diagram showing a phase synchronizing circuit of the digital PLL circuit shown in FIG. 1.

An exemplary construction of a phase synchronizing circuit is explained by referring to FIG. 7. In this figure, the above mentioned master clock MCK is supplied to terminal 12. The edge detection signal ED, indicating the presence OF absence of the signal edge of the input signal RF in, is supplied to a terminal 16, while an edge signal EP indicating the edge position of the input signal based on the master clock period TMC is supplied to a terminal 38.

The edge detection signal ED, supplied to terminal 16, is entered to a multi-bit, e.g. 9-bit shift register 51 so that plural bits, e.g. 9 bits, are outputted in parallel in a chronological order. The output signal is supplied to a reproducing clock period latch circuit 53 via a window circuit 52 having a time duration of a reproducing clock period. The 9-bit output from the reproducing clock period latch circuit 53 is converted by an edge position integer part decoder 54 into e.g. a 4-bit binary value signal which is supplied to a subtraction unit 55. The edge position signal EP, supplied to terminal 38, is a data representing the edge position in plural bits, e.g. 6 bits, on the basis of the master clock period TMC. These bits, herein six bits, are supplied in parallel to a multi-stage (e.g. 9-stage) shift register 56. The 6-bit parallel nine-stage output of the shift register 56 is transmitted to a selector 57 where the 6-bit edge position data of that one of the stages where the input edge is present is selected and transmitted to the reproducing clock period latch circuit 53. The data is coupled as a fractional part 6-bit data for the edge position to the lower order side of the integer part data from the edge position integer part decoder 54 and the data thus coupled together is supplied to a subtraction unit 55.

Reproducing clock period data TRC as later explained is supplied to a terminal 61. The reproducing clock period data TRC is also supplied to an additive unit 62. The additive unit 62 forms a loop along with a latch circuit 63 and an additive unit 64, which loop is equivalent to a voltage controlled oscillator VCO forming a part of the PLL. That is, while data makes a round of the loop, reproducing clock period data is added to the data at the additive unit 62. Phase error correction data is added to the data at the additive unit 64. The phase error correction data to the additive unit 64 is supplied from the subtractive unit 55 via a quarter circuit 58 and a flop-flop circuit 59. The edge detection signal present in a window from the edge position integer part decoder 54 is supplied as an addition control signal. If there is the edge in the window, output data of the latch circuit 63 and the error correction signal data from the flip-flop circuit 59 are summed together and the resulting sum signal is outputted. If there is no edge in the window, the output data of the latch circuit 63 is outputted.

The reproducing clock period data TRC from terminal 61 is frequency-halved by a frequency halved 65 to form half-period reproducing clock TRC/2 which is supplied via latch circuit 63 to an additive unit 66. Data of the lower 6 bits of the 9-bit output data from the additive unit 64 is supplied to the additive unit 66. The resulting sum signal is transmitted to window generator 67. The lower 4-stage data (input stage data) from the 6-bit parallel 9-stage parallel shift register 56, that is 24-bit data, is supplied to the window generator 67. An output of the window generator 67 is transmitted to a window circuit 52 having a time duration corresponding to one period of the reproducing clock.

The Upper 3-bit data of the 9-bit output of the additive unit 64 is supplied to a comparator 71. The master clock MCK from terminal 12 is supplied to a 3-bit counter 72. An output of the 3-bit counter 72 is supplied to comparator 171. If these two inputs are found to be coincident at the comparator 71, coincidence output is transmitted as a reproducing clock period enable signal RCE to respective enable terminals of the reproducing clock period latch circuit 53 and latch circuit and to output terminal 73. This reproducing clock period enable signal RCE is outputted via flip-flop 74 at output terminal 75 as reproducing clock output signal RCK. The reproducing clock period enable signal RCE, outputted from comparator 71, is transmitted to AND gate 76. An output signal of AND gate 76 is outputted at output terminal 79 via flip-flops 77, 78.as shaped RF output signal RF out. The master clock MCK from terminal 12 is supplied to clock input terminals of the flip-flops 74, 77 and 78. The edge detection signal is supplied to AND gate 76 from the edge position integer part decoder 54.

In general, the digital PLL detects an amount of relative shift of an input edge from the ideal OF "must" input edge position based on a master clock and causes the reproducing clock phase to be changed responsive to the amount of the shifting. The must input edge position may be calculated finely by finely measuring the time duration of a period by a master clock and integrating the time periods. However, since the input edge time is measured on the basis of a master clock as a minimum time measuring unit, it is subject to a time error corresponding to the width of the master clock period TMC. Although the input edge is found under an assumption that it is at a center position of the period of the master clock period, it is still subject to an error of the width of the master clock period TMC. Conversely, according to the present invention, the fine edge position may be obtained from the edge position signal EP, whereby an error in the edge position may be found accurately. the window boundary may also be found accurately.

The edge detection signal ED, supplied to terminal 16 of FIG. 7, is entered at the shift register 51 of e.g. 9 bits, from which a 9-bit parallel-output may be produced in the chronological order. The 9-bit parallel output of shift register 51 is transmitted via a window circuit 52 having a time duration of a reproducing clock period to the reproducing clock period latch circuit 53. The 9-bit parallel output of shift register 51 is latched at an optimum timing if it is locked by PLL and the phase error of the input edge is equal to 0. The latching duration is the period TRC of the playback clock RCK.

The edge position signal EP of e.g. 6 bits, supplied via terminal 38 of FIG. 7, is entered in a 6-bit parallel array at a multi-stage shift register 56 of e.g. nine stages. The 6-bit, parallel output of shift, register 56 is transmitted to select, or 57. The 6-bit, parallel output of select, or 57 is captured by the reproducing clock period latch circuit 53 at the period TRC of the reproducing clock RCK. If the latched signal is shift,ed at, a 1-bit, offset position with respect to a pre-determined position, it, may be concluded that the phase or timing deviation is 1 bit with respect to the master clock period TMC as reference. It may be found from a separately latched edge posit,ion signal at which position the edge is located within the master clock.

Figure 8:
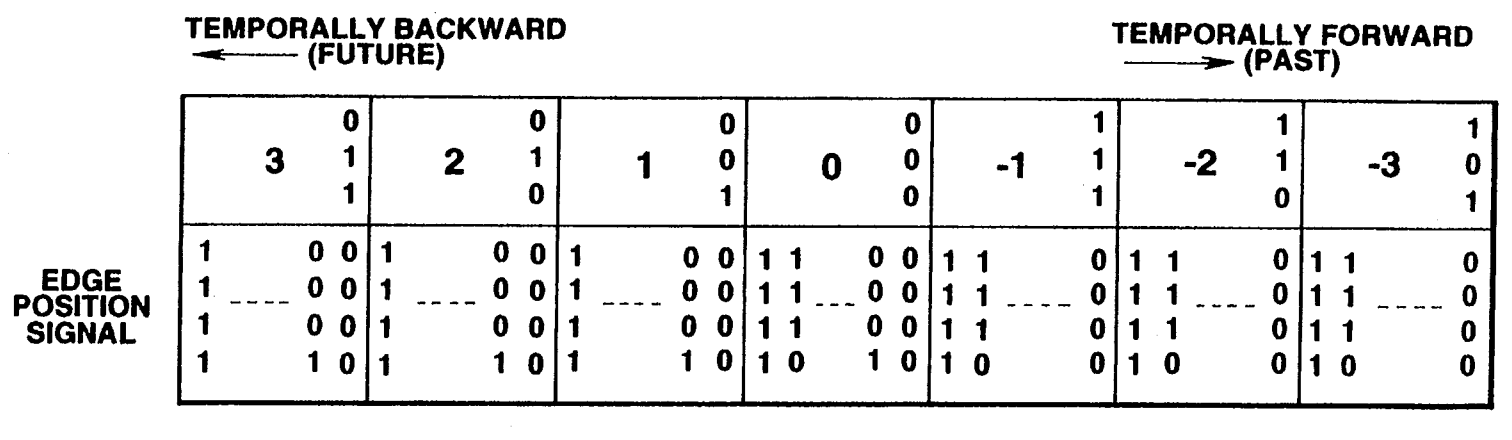

The edge position relative to a master clock is represented by an integer, such as 1, 2, ... in the temporally backward or future direction and −1, −2, ..., in the temporally forward or past, direction, with an optimum latch timing being 0. On the other hand, an edge position signal, indicating an edge position within the master clock is represented by a fractional number from 0 to less than unity from the forward to the backward direction. The input edge position may be represent, ed as a numerical figure by combining the integer and fractional parts together. Referring to FIG. 8, the temporally foremost position within the central bit, becomes 0.0. In the concrete example of FIG. 8, with the number of shift register stages equal to 7, the integer part, is represented by 3 bits, and the edge position signal is represented by 4 bits (0000 to 1111 ).

Figure 9:
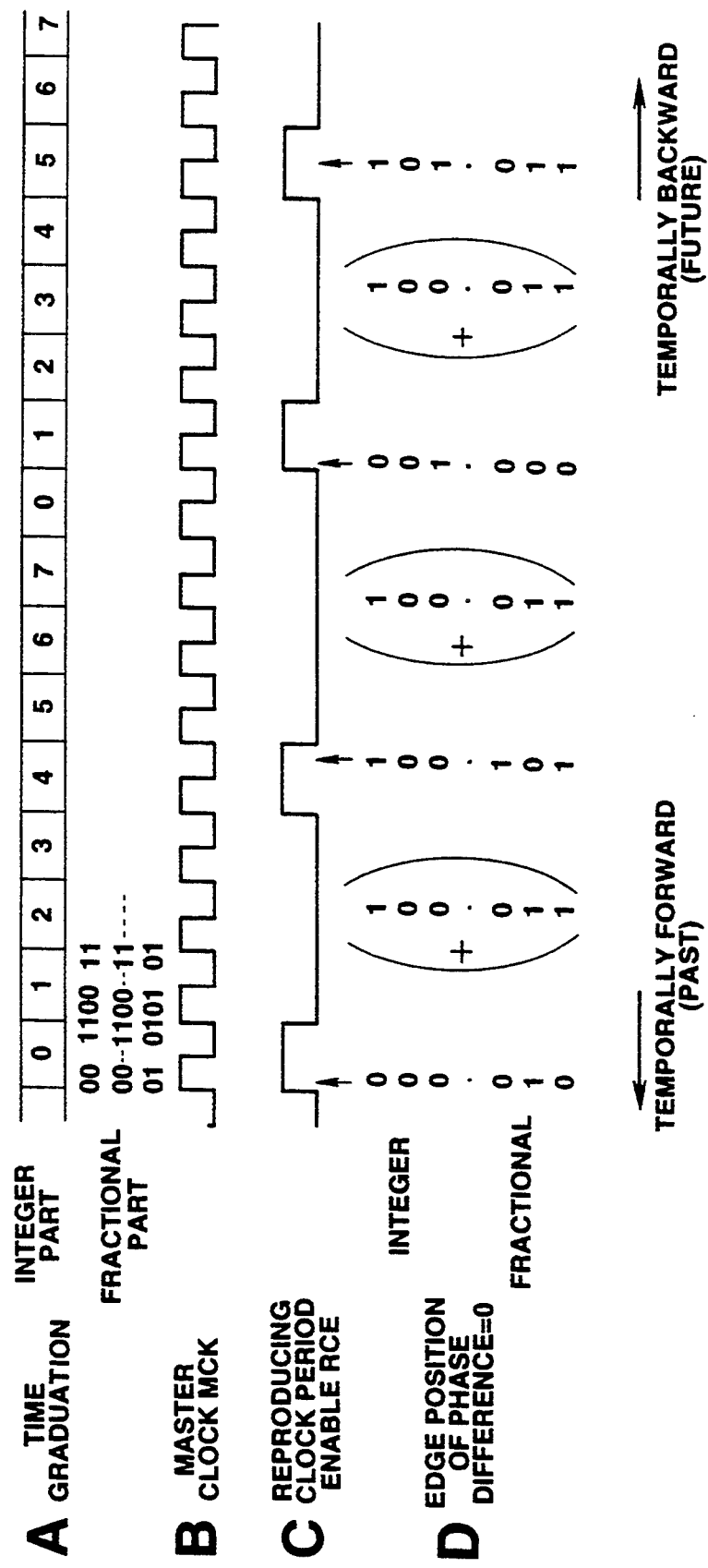
FIG. 9 shows the calculation of edge positions for a phase error of 0.

The latching timing is calculated more finely than on a bit-by-bit basis. That is, the reproducing clock period TRC is not represented by an integer number, such as 5 TMC or 6 TMC in terms of master clock periods, but by a number inclusive of a fractional part. A number of these clock periods are integrated to give a result of integration, an integer part of which forms a timing to be latched. There also is a fractional part. The edge position signal in the input edge free of phase errors at the time of latching is represented by the fractional part which is to be used for preparing the latch timing. A concrete example is shown in FIG. 9.

In the concrete example of FIG. 6, the integer part and the fractional part are each composed of 3 bits, for simplifying the illustration, with the period duration TRC of the reproducing clock being 100.011.

By subtracting the fractional part of a numerical figure which should form the latch timing from a previously found numerical figure indicating the edge position, the extent of deviation from a time at which the edge should exist may be found. It suffices to subtract only the fractional part because the integer part is used for determining the latch timing. In this manner, the edge phase error may be 1"round with accuracy substantially higher than the master clock.

In sum, an output of shift register 51, supplied with the edge detection signal ED, is latched via window circuit 52 by the latch circuit 53 for each reproducing clock period enable signal RCE. On the other hand, the edge position signal EP corresponding to the bit, of the shift register output for which the edge detection output is set is selected for shift register 56 via selector 57 so as to be latched by latch circuit 53. Meanwhile, the reproducing clock period enable signal RCE is an enable signal which is generated responsive to the "must" edge position as calculated within the phase synchronizing circuit.

An output of shift register 51, captured by latch circuit 53, is adapted to appear at a center bit, for example, the fifth bit for the 9-bit shift register, if the PLL is locked and the input edge is at a correct timing. The decoder 54 supplied with the output of the latch circuit 53, outputs a value which is incremented in the negative direction from the 0 center position, as −1, −2, ..., while outputting a value which is incremented in the positive direction, as +1, +2, ..., with the center position being 0.

The decoder 54 also outputs a result of edge presence of absence detection indicating whether there is an edge detection flag in any of bits in the window. The correct input edge position is found by adding the edge position signal simultaneously latched by the latch circuit 53 at sub-binary positions of the values of the edge bit positions. The foremost part Of the number becomes 0.0 within the center bit time. The input edge error may be found with high accuracy from this numerical value. This error is attenuated to e.g. 1/4 by a frequency divider 58 for providing a suitable loop gain for forming an error correction signal which then is added to the loop for performing a phase control.

Calculation of a window boundary using the edge position signal EP is hereinafter explained.

The edge detection signal ED, supplied to terminal 16, is entered into the 9-bit shift register 51, from which a 9-bit parallel output is produced. This output is transmitted to the reproducing clock period latch circuit 53 via window circuit 52 having a time duration equal to one reproducing clock period.

If the PLL is in locking state and the input edge phase error is equal to 0, the 9-bit; parallel output of shift register 51 is latched at an optimum timing. The latching timing is equal to the period TRC of the reproducing clock RCK. Since latching is made for each reproducing clock period TRC, the state of shift register 51 is advanced by only one reproducing clock period TRC until next capturing occurs. Consequently, if all of the nine output bits are captured, it may occur that the edge once captured by latch circuit 53 is again captured with the next, capturing so that an edge may be counted twice. In order to avoid such situation, a window circuit 52 having a duration of one reproducing clock is arranged between shift register 51 and latch circuit 53 so that only the bit output corresponding to $+\frac{1}{2}$ reproducing clock period ($\pm$TRC/2) centered about a predetermined bit of shift register 51 is passed without passing the remaining bits.

The latch timing signal is produced as reproducing clock period enable signal RCE from a comparator 71 constituting a phase synchronizing circuit. The reproducing clock period enable signal RCE is not produced in accordance with the master clock period TMC, but is produced more finely based on units of the measurement unit time run. The reason is that the reproducing clock period TRC is obtained as a numerical figure having a sub-binary point portion and the phase correction signal also controls the reproducing clock RCK by units smaller than sub-binary points.

The window boundary in the window circuit 52 having a time length of one reproducing clock period is $\pm\frac{1}{2}$ reproducing clock period from the theoretical or must edge position ($\pm$TRC/2). Although rounding may be used for deciding whether the bit at the boundary line is included in the window, the input edge position is judged by the edge position signal EP of the boundary bit and, if the bit is smaller or larger than the fractional part of the boundary value, the boundary bit is included in the window or deemed to be outside the window, respectively. In the latter case, the bit is captured next time.

Figure 10:
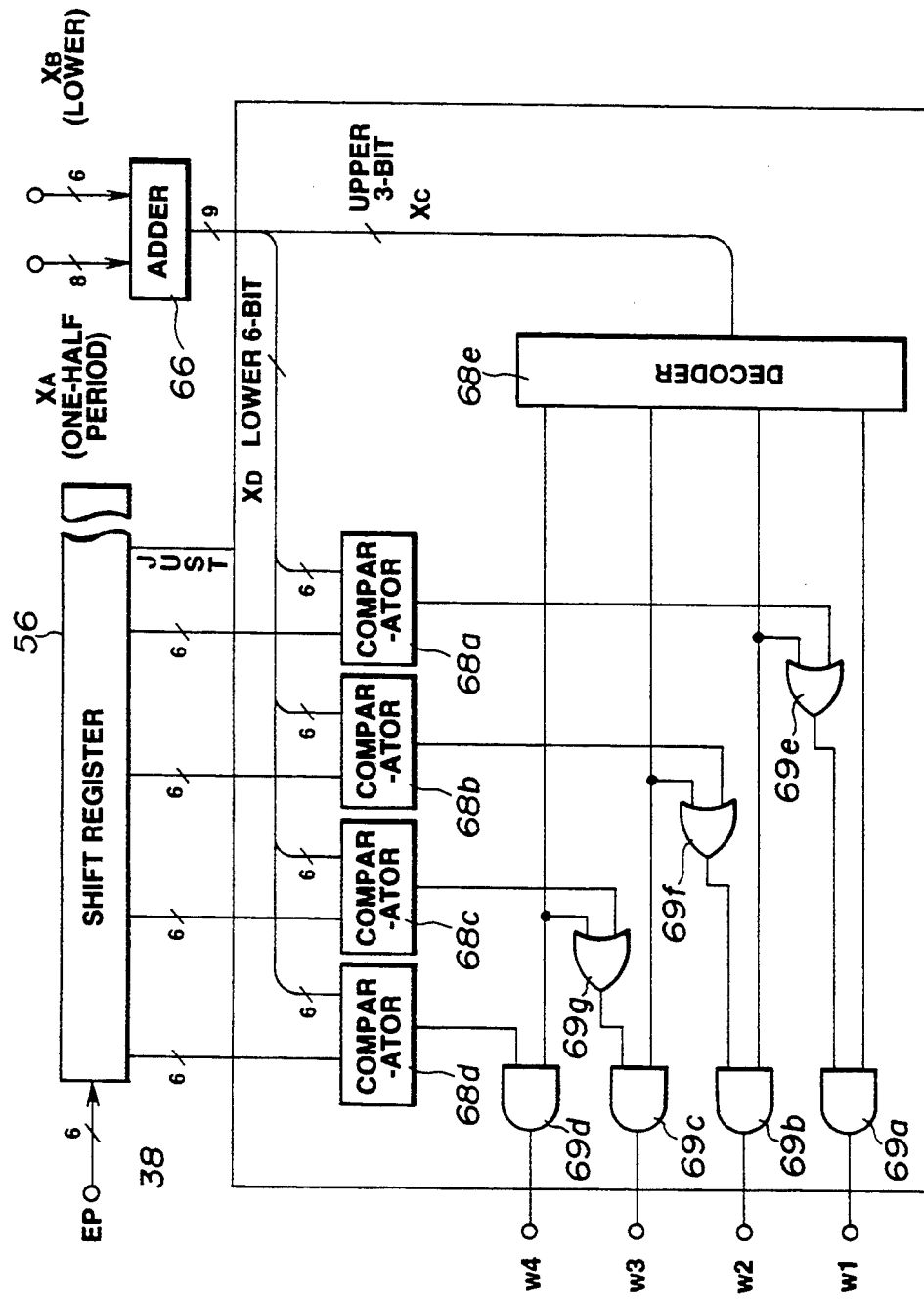
FIG. 10 is a block circuit diagram showing an exemplary window generator in FIG. 7.
Figure 11:
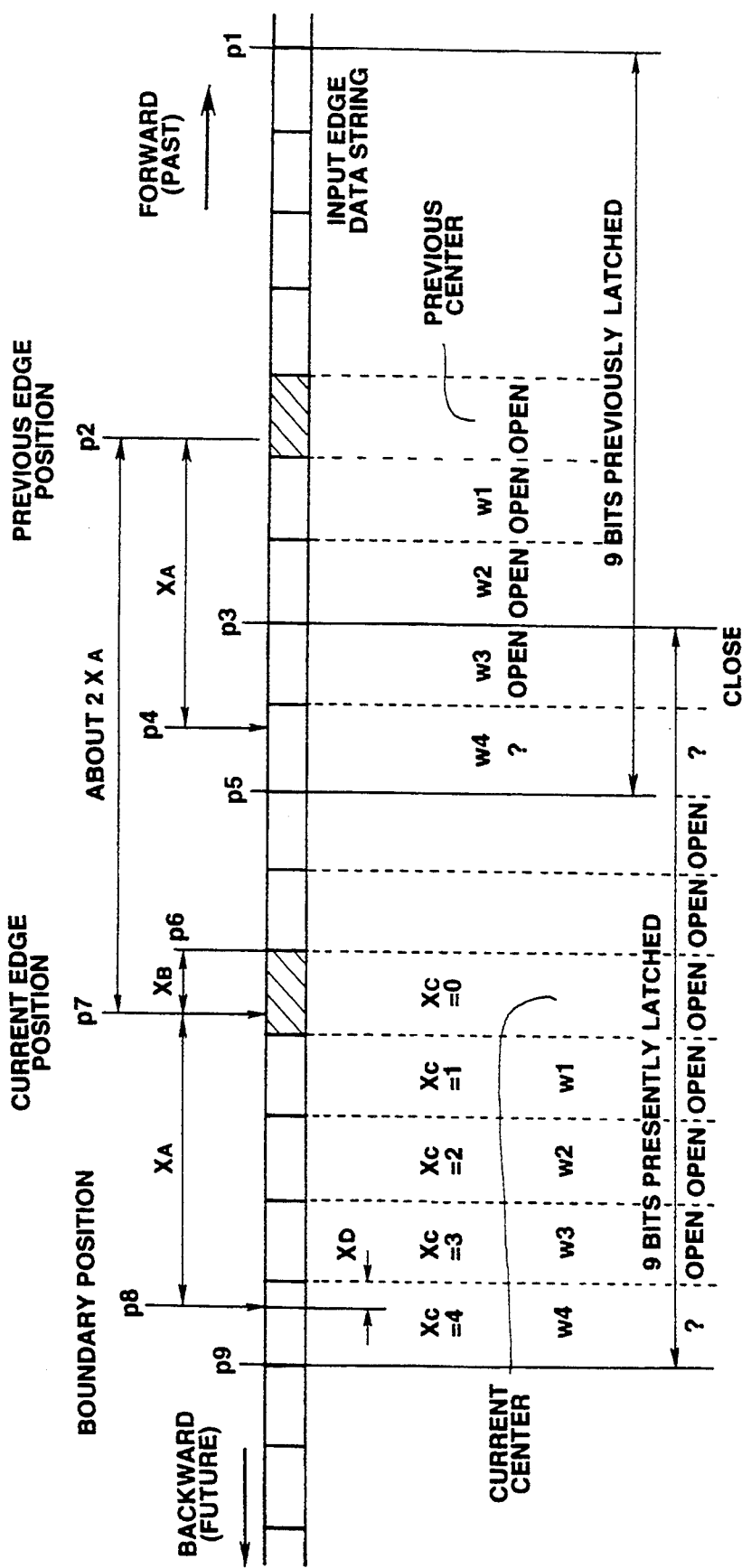
FIG. 11 illustrates the operation of the window generator shown in FIG. 10.

FIGS. 10 and 11 are a block circuit diagram for illustrating a concrete example of a window generator 67 for calculating the above-mentioned window range and an illustrative view for illustrating its operation.

The adder 66 in FIG. 10 is supplied with data XA indicating a one-half period TRC/2 of the reproducing clock, produced from frequency divider 65 via latch circuit 63, and data XB which is the lower 6-bit data of the 9-bit output from adder 64 and which indicates the must edge position within the center bit. Of the 9-bit sum data, the data XC of the Upper 3 bits represents the bit where the boundary exists and the lower 6 bit data XD represents the boundary position within the boundary bit. These data XA to XD are shown in FIG. 11.

The four 6-bit parallel output towards the temporally later OF left-side of the just-center position of the shift register 56 in FIG. 10 is supplied to comparators 68a, 68b, 68c and 68d. The lower 6-bit output of the 9-bit output from adder 66, that is data indicating the boundary position within the boundary bit XD, are compared and, if XD is larger, a "H" OF "1" is outputted.

The data XC indicating the boundary bit as the upper 3-bit output of the adder 66 is sent to decoder 68e. If the data XC is 1 or more, 2 OF more, 3 OF more and equal to 4, a signal "H" is supplied to AND gates 69a, 69b, 69f, 69C, and 69d, respectively. An output of comparator 68a is supplied via OR gate 69e to AND gate 69a. An output of comparator 68b is supplied via OR gate 69f to AND gate 69b. An output of comparator 68c is supplied via OR gate 69g to AND gate 69c. An output of comparator 68d is directly supplied to AND gate 69d. Outputs of these AND gates 69a to 69d are taken out as window signals W1 to W4 which are supplied to a window circuit 52 having a 1time duration of the reproducing clock shown in FIG. 7.

Referring to FIG. 11, if the previous edge position is at point p2 of an input: edge data string, the nine bits previously latched are within a range of from point p1 to point, p5 or 4 bits ahead and back of the center bit, containing the point p2. The left side or temporarily later side boundary of the window is found to be point p4 in FIG. 11 by adding the reproducing clock halfperiod data XA to the music center bit edge position (point p2).

The current edge position is the point, p7 obtained by adding 1she reproducing clock period TRC or twice the half period data XA to the point p2. The 9 bits presently latched is in a range from point p3 to point p9 with the bit, containing the point, p7 as center. The point p8 obtained by adding the half-period data to the left or future side of the current edge position (point p7) represents the left-side boundary position . The point p4 which is the previous left side boundary may be used as the right, side boundary position.

If it, is determined by rounding that the bit at the boundary is contained in the window, high accuracy is not obtained. With the embodiment of the present invention, the edge position signal of the boundary bit, and the position within the boundary bit, calculated as above (sub-binary point, component) are compared and, if the edge is inside of the boundary, it is contained in the window, whereas, if the edge is outside the window, it is captured at the next timing.

Most random errors in the actual reproducing signal are caused by the fact that the edge is deviated by a peak shifting phenomenon and, if the noise acts as an influencing factor, the edge is detected with a shift corresponding to one reproducing clock period TRC. Thus the error rate may be improved by the correctness of the window boundary.

Figure 12:
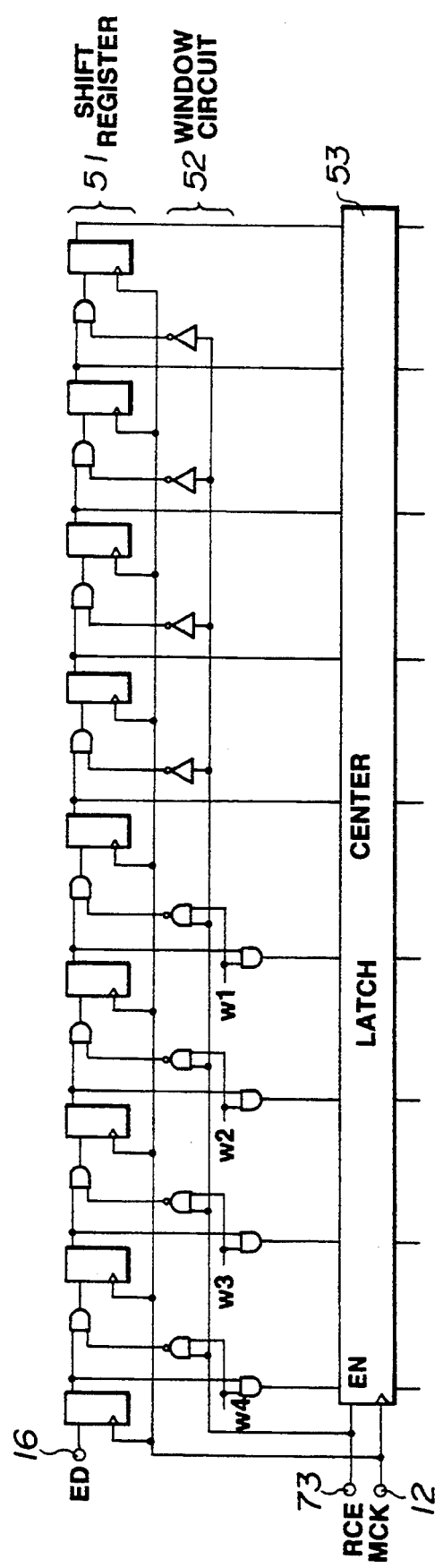
FIG. 12 is a block circuit diagram showing the window circuit of FIG. 7 and the peripheral circuitry.

Besides, the right-side boundary may be disregarded by unifying the signals shifted through the shift register to an edge-free polarity with respect to bits passed through the window during the previous latching. A concrete example is shown in FIG. 12. The edge detection signal transmitted through the window circuit 52 and latched by the latch circuit 53 is cleared to 0 at the next stage of shift register 51. The edge-presence signal, once latched,is not shifted though shift register 51, so that the window construction towards right of the center may be omitted. Since the highly accurate window may be prepared in this manner, the input edge may be phase-compared to the correct timing reproducing signals to diminish the occurrence of signal errors.

Returning to FIG. 7, an error quantity of the highaccuracy input edge as found by the subtractor 55 is attenuated to one-fourth by the frequency divider 58 to form an adequate loop gain to form an error correction signal which is supplied via flip-flop circuit 59 to an adder 64.

The adder 64 forms a loop of PLL along with adder 62 and latch circuit 63. The reproducing clock period TRC and the accurate error correction quantity are supplied to the adders 62 and 64, respectively. The latch circuit 63 is a flip-flop having the reproducing clock enable signal RCE as an enable signal and captures data for each reproducing clock period TRC. If the error correction quantity is 0 at all times, the figure in the loop is increased by one period of the reproducing clock TRC.

There is also provided a counter 72 of e.g. 3 bits for counting up for each master clock MCK so as to be used as a measure for timing. If the output of counter 72 coincides with the unit bit quantity of the 9-bit output from the loop (the upper three bit integer part mentioned above), comparator 71 outputs the reproducing clock period enable signal RCE. As the case may be, comparator 71 captures an output signal of shift register 51 such as edge detection signal ED or updates the numerical figure in the loop to a corresponding figure increased by one reproducing clock period. The numerical figure in the loop thus updated (output value of adder 64) represents the timing of outputting the next reproducing clock period enable signal .

When the count value of counter 72 corresponds to the value of such timing, comparator 71 outputs the next reproducing clock period enable signal RCE.

The above-mentioned numerical figure in the loop represents the must position for the input edge. That is, the upper three bit integer part of the 9-bit output of the loop adder 64 represents the timing of capturing the just-input edge when it appears at the center of the register 51 by control 11rig the output timing of the reproducing clock period enable signal RCE. The lower 6-bit fractional part is subtracted from the input edge position so as to be used for finding an error quantity. In window generator 67, the half-period of the reproducing clock is added to the numerical value of the loop so that the integer part and the fractional part represent the bit-based window boundary and the detailed boundary value within the bit, respectively.

The ultimate reproducing clock RCK is formed from the reproducing clock period enable signal RCE and from the above mentioned master clock MCK. That is, by transmitting the reproducing clock period enable signal RCE to the flip-flop 74 having the master clock MCK as the clock, the reproducing clock RCK synchronized to the master clock MCK is produced by the flip-flop 74. Data output is produced from a signal indicating the edge presence or absence in the window from the edge position integer part decoder 54, the reproducing clock period enable signal RCE and the master clock MCK. An output of AND gate 76 is taken out via flip-flops 77, 78 at terminal 79 as an RF output signal RF out.

Figure 13:
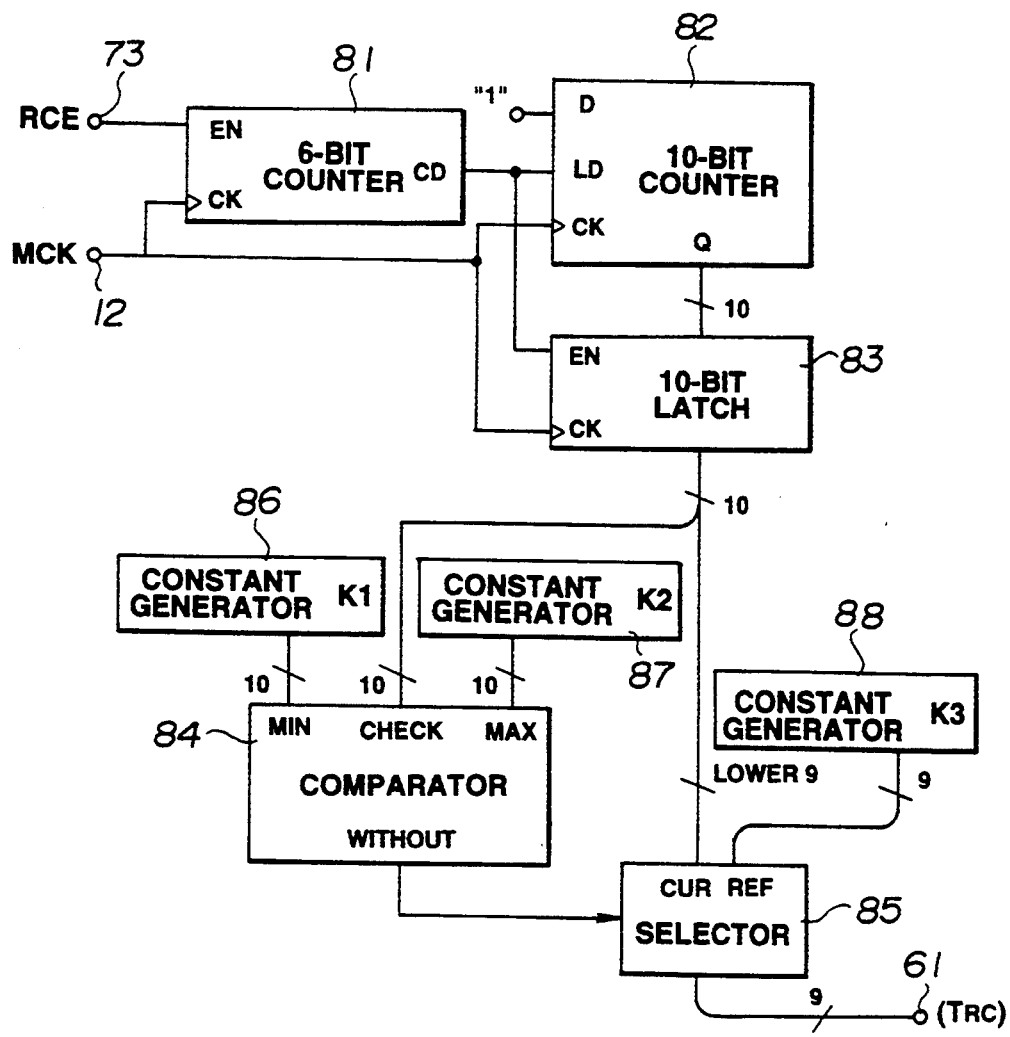
FIG. 13 is a block circuit diagram showing an exemplary circuit for measuring a reproducing clock period.

A concrete example of a reproducing clock period length measurement circuit for producing the reproducing clock period data (TRC) to be supplied to terminal 61 is explained by referring to FIG. 13.

In this figure, master clock NCK from terminal 12 is supplied to each of clock input terminals of the 6-bit counter 81, 10-bit counter 82 and 10-bit latch circuit 83. The reproducing clock period enable signal RCE from terminal 73 is transmitted to an enable terminal of a 6-bit counter 81, while a count output of the 6-bit counter 81 is supplied to a load terminal of the 10-bit counter 82 and to enable terminal of 10-bit, latch circuit, 83. The data input terminal of the 10-bit counter 82 is perpetually supplied with "1". An output of the 10-bit counter 82 is supplied to comparator 84 and to selector 85 via 10-bit latch circuit 83. A constant K1 which is to be the least comparison value or-lower limit value and a constant K2 which is to be the maximum or upper limit value are supplied to comparator 84 from constant generators 86, 87, respectively, and a comparison output indicating if these constants K1 and K2 are within these ranges is outputted to select, or 85. Selector 85 selects one of the output of the 10-bit. latch circuit, 83 and the constant K3 from constant, generator 88, depending on an output of comparator 84, for supplying the selected data as the one-period length data TRC to terminal 61.

The one-period length data TRC is represented by a numerical value normalized so that the master clock period TMC is equal to 1. If viewed over a reproducing clock cycle, there are not many master clocks in it, so that highly accurate measurement cannot be achieved. Thus the number of master clocks contained in a 2n number of reproducing clocks, n being an integer equal to two of more, is counted, and the resulting count is divided by 2n. For division by 2n, it suffices to make a shift of n bits, so that highly accurate measurement can be made easily.

The resulting measured value is not used directly as a reproducing clock period length, but is checked as to if the value is in a lock range. That is, the value is compared by comparator 84 with the preset lower and Upper values K1, K2 of the period to select an output of the 10-bit latch circuit 83 if the value is comprised within the range defined by these values. If otherwise, the selector 85 selects and outputs the pre-set center period K3 from constant generator 88 in place of the measured value as the reproduced clock period length data. If limitation is not imposed on the lock range, it takes a prolonged time until locking such that so-called pseudo-locking tends to be produced. It is noted that the concrete example of the reproducing clock period duration measurement circuit is not limited to the embodiment shown in FIG. 13.

Returning to FIG. 1, the input edge position can be grasped by taking a difference between the value of the ring oscillator 30 captured with the input edge (the above-mentioned state of the output RS) and the value of the ring oscillator 30 captured at the master clock MCK. For taking the difference, it is necessary to capture the signal by the input edge by the flip-flop circuit 23 further by the master clock period MCK by the flip-flop circuit 24 to give a master clock synchronizing signal. However, the signal captured by the master clock is a signal changed with the timing of the input edge not synchronized with the master clock. Therefore, if an input to the flip-flop circuit 24 for capturing the master clock is changed within a setup time or hold time of the flip-flop circuit 24, it becomes indefinite which of the -inputs before and after the change has occurred is to be captured. Since the flip-flop circuit 24 is composed of a number of flip-flops equal to the number of stages of the ring oscillator 30, new and old data co-exist on the bit-by-bit basis.

Figure 14:
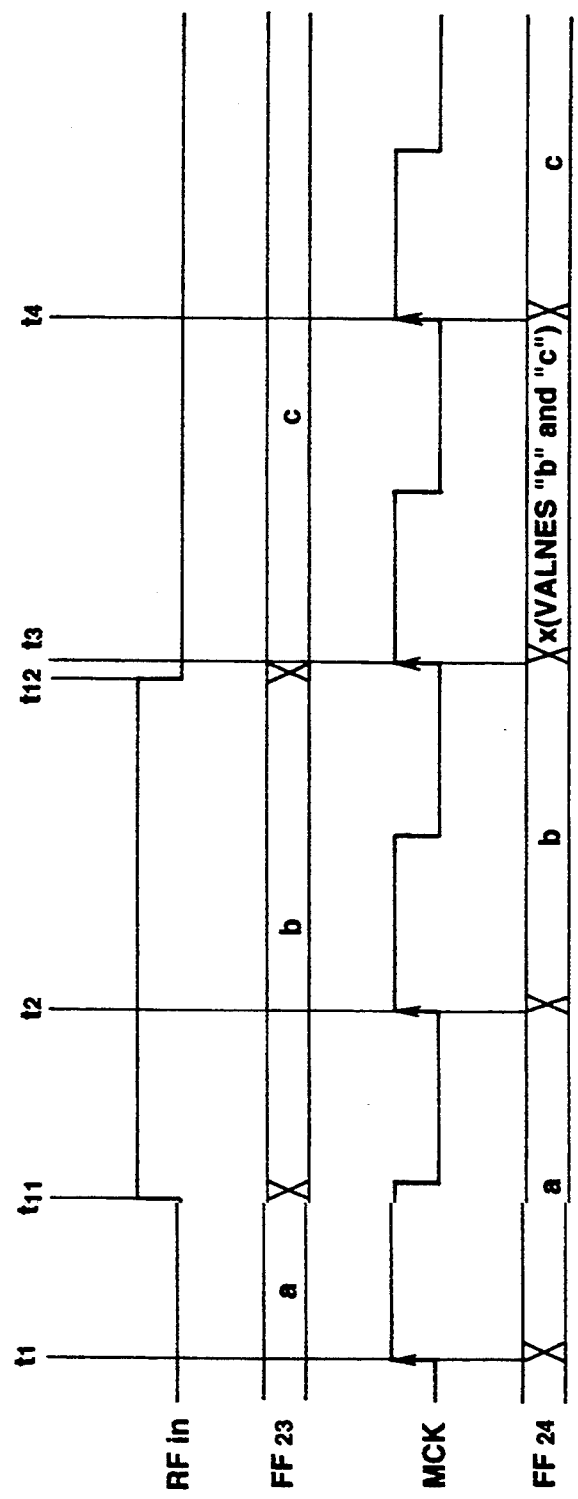
FIG. 14 is a timing chart for illustrating mistaken detection of the input edge position.

FIG. 14 shows an output FF23 of the flip-flop circuit 23, master clock MCK and an output FF24 of the flip-flop circuit 24, responsive to the RF input signal RF in. In FIG. 14, A, b and indicate the value or statuses of the ring oscillator 30. In FIG. 14, at timing t1 when the flip-flop circuit 23 captures the status "a" of the ring oscillator 30, master clock MCK rises to cause the flip-flop circuit 24 to capture the value "a". At a rise time t11 of the input signal RF in, flip-flop circuit 23 captures the ring oscillator value "b" which in turn is captured by the flip-flop circuit 24 at the rise time t2 of the master clock MCK. If the master clock MCK rises at a timing t3 immediately after the decay time t12 of the input signal RF in, capturing by the flip-flop circuit 24 is performed during the hold time of capturing of the ring oscillator value "c" at timing t12 by the flip-flop circuit 23, with the result that the output of the flip-flop 24 after timing t3 may be values "b" and "c" on the bit-by-bit basis.

Figure 15:
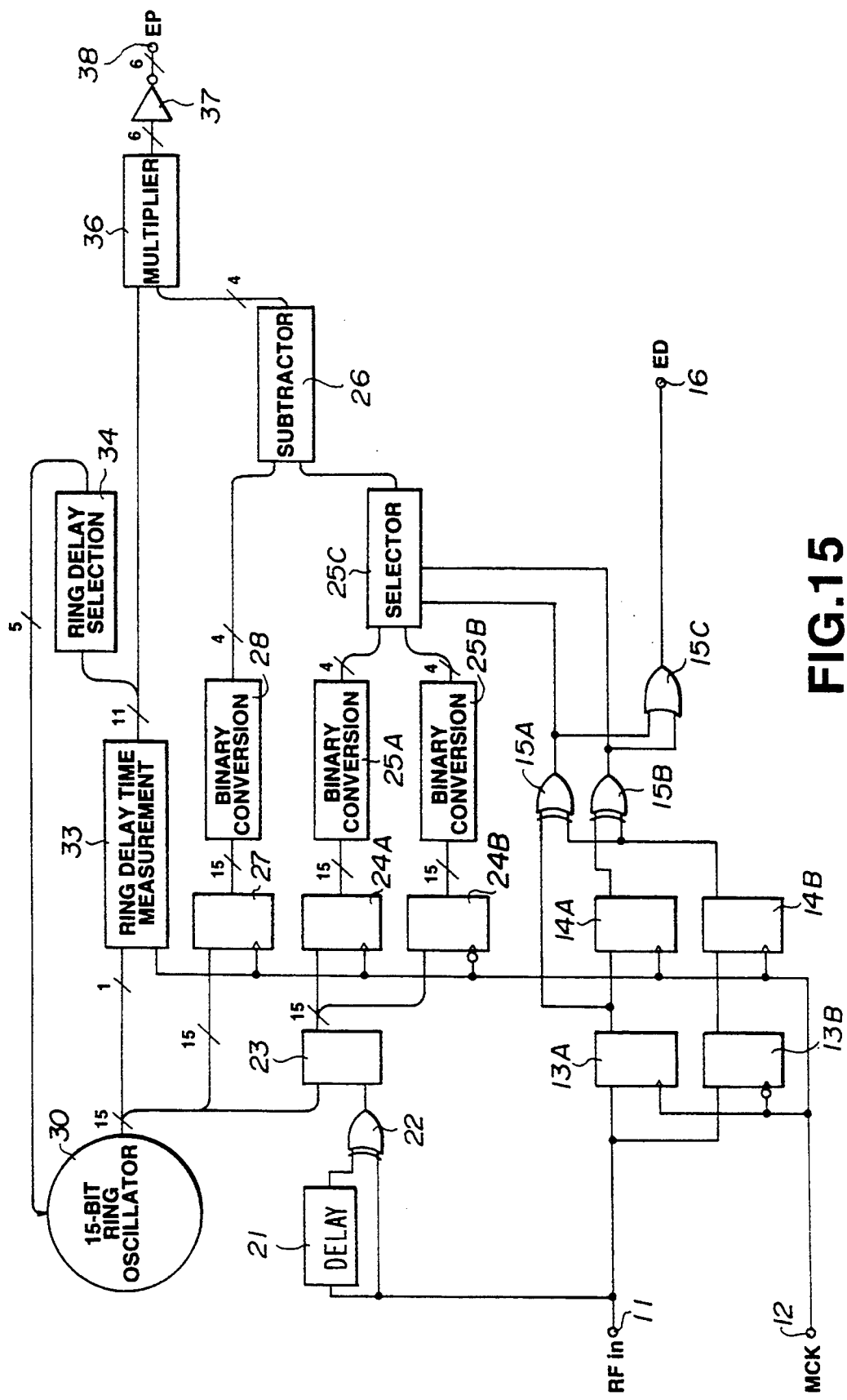
FIG. 15 is a schematic block circuit diagram of a circuit for measuring the edge timing of input signals in a manner free from mistaken detection of the input edge position.

For this reason, the present embodiment makes use of the circuit construction shown in FIG. 15 to avoid the drawback incurred by the asynchronous signal capturing mentioned above. The arrangement of FIG. 15 is modified from the arrangement shown in FIG. 1 as to the circuit between the flip-flop circuit 23 and the subtractor 26 and between the flip-flops 13A, 13B and OR gate 15C. The remaining unchanged portions are indicated by the same reference numerals and the corresponding description is omitted for simplicity. A ring delay selection circuit 34 plays the role of switching the delay timings of the ring oscillator elements as will be explained subsequently.

In FIG. 15, an output of the flip-flop circuit 23 is supplied to a flip-flop circuit 24A and flip-flop circuit 24B which capture the output at the rise and decay timings of the master clock MCK, respectively.

An output of flip-flop circuit 24A and an output of flip-flop circuit 24B are supplied to selector 25C via binary conversion circuits 25A and 25B, respectively. An output of selector 25C is transmitted to subtractor 26 where it is subtracted from an output of the binary converting circuit 28. The input RF signal RFin from input terminal 11 is supplied to flip-flop 13A which captures it at the rise time of master clock MCK and to flip-flop 13B which captures it at the decay timing of master clock MCK. An output of flip-flop 13A is transmitted to flip-flop 14A and to exclusive OR (EX-OR) circuit 15A while an output of flip-flop 13B is supplied to flip-flop 14B. An output of flip-flop 14A is supplied to EX-OR circuit 15B, while an output of flip-flop 14B is supplied to EX-OR circuits 15A, 15B.

Outputs of EX-OR circuits 15A, 15B are supplied to selector 25C as selection control signals, while being also transmitted to OR gate 15C. An output of OR gate 15C is taken out at terminal 16 as an edge detection signal ED.

As to latch output data of the flip-flop circuit 23 at the input edge, it should be noted that data which is changed at a timing of producing an error when capturing is made at the rise timing of the master clock MCK does not become an error when capturing is made with the decay of the master clock MCK. If simply the capturing is made at the decay timing of the master clock MCK, data of such timing as to produce an error when capturing is made with the decay timing presents a problem. In this consideration, data captured at a rise timing or decay timing, whichever will not produce an error, is to be selected.

Figure 16:
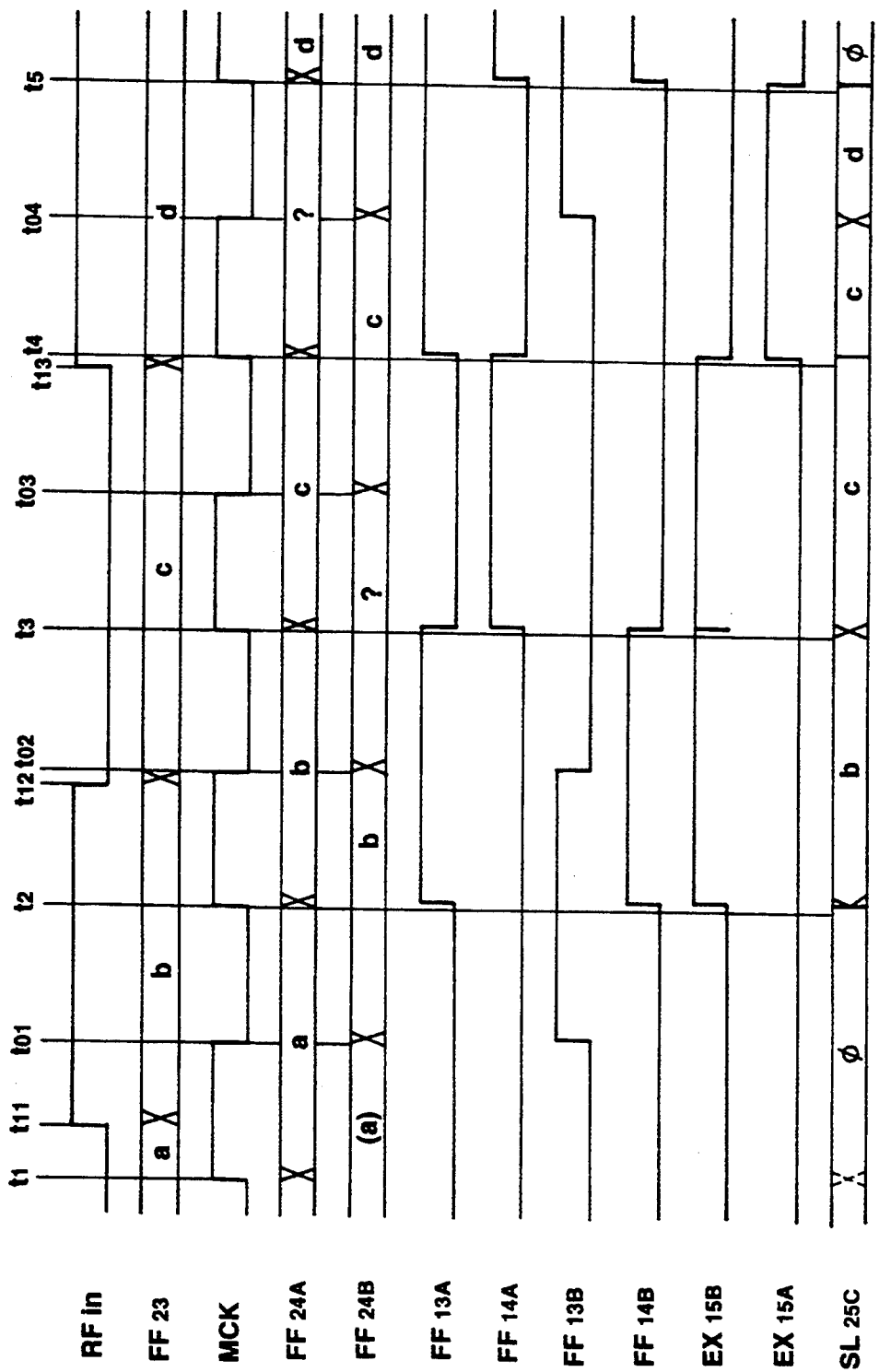
FIG. 16 is a timing chart for illustrating the operation of the circuit shown in FIG. 15.

FIG. 16 is a time chart showing the signal waveform and states (values) at various portions of FIG. 15. Signal FF23 is an output of flip-flop circuit 23, while signal EX15B is an output of EX-OR circuit 15B and signal SL25C is an output of selector 25C. In the example of FIG. 16, master clock MCK decays at time tO2 directly after decay time t12 of the input edge, while master clock MCK rises at a timing t4 directly after rise time t13 of the input edge.

In the example shown in FIG. 16, latch data from flip-flop circuit 23 which has undergone transition during the time when the master clock MCK is at a low level, that is during the time points tO1 and t2, tO2 and t3, etc. such as data "d" captured by the flip-flop circuit 23 by the input edge which has risen at timing t13 between timing tO3 and t4, is captured by flip-flop circuit 24B at decay timing tO4 of the next master clock MCK. The reason is that, if the data "d" is relatched with the rise of the master clock MCK at timing t4, the set time (hold time) of the flip-flop circuit 23 is not satisfied when the input edge is immediately ahead of the rise of the master clock such that capturing cannot be made correctly. Therefore, the data "d" is captured by the flip-flop circuit 24B at the decay timing tO4 of the next master clock MCK.

Conversely, latch data from flip-flop circuit 23 which has undergone transition during the time when the master clock MCK is at a high level, that is during the time points t1 and tO1, t2 and tO2, etc. such as data "c" captured by the flip-flop circuit 23 by the input edge which has decayed at timing t12 between timing t2 and tO2, is captured by flip-flop circuit 24A at rise timing t3 of the next master clock MCK. The reason is that, if the data "c" is re-latched with the decay of the master clock MCK at timing tO2, the setup time (hold time) of the flip-flop circuit 23 is not satisfied when the input edge is immediately ahead of the decay of the master clock, such that capturing cannot be made correctly. Therefore, the data "c" is captured by the flip-flop circuit 24A at the rise timing t3 of the next master clock MCK.

Figure 17:
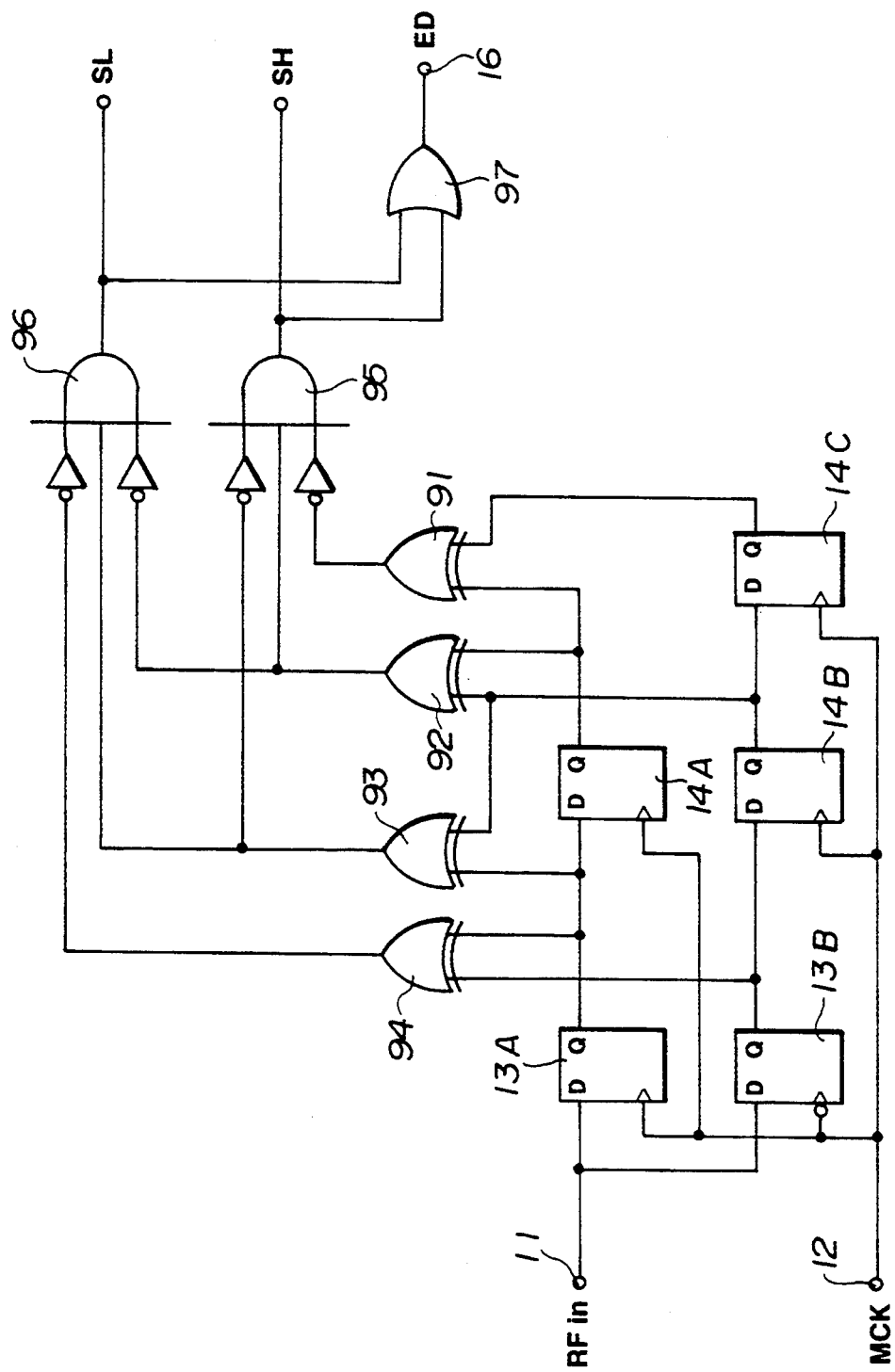
FIG. 17 is a circuit diagram for illustrating a modified embodiment for inhibiting mistaken detection of the input edge position.

If the input edge has continued over two half periods of the master clock TMC/2, both edges can be canceled using the circuit shown for example in FIG. 17. In the circuit of FIG. 17, only the circuit portions corresponding to the arrangement from terminals 11, 12 up to the terminals 16 of FIG. 15 are shown, and output signals of the respective flip-flops are indicated in FIG. 18.

Figure 18:
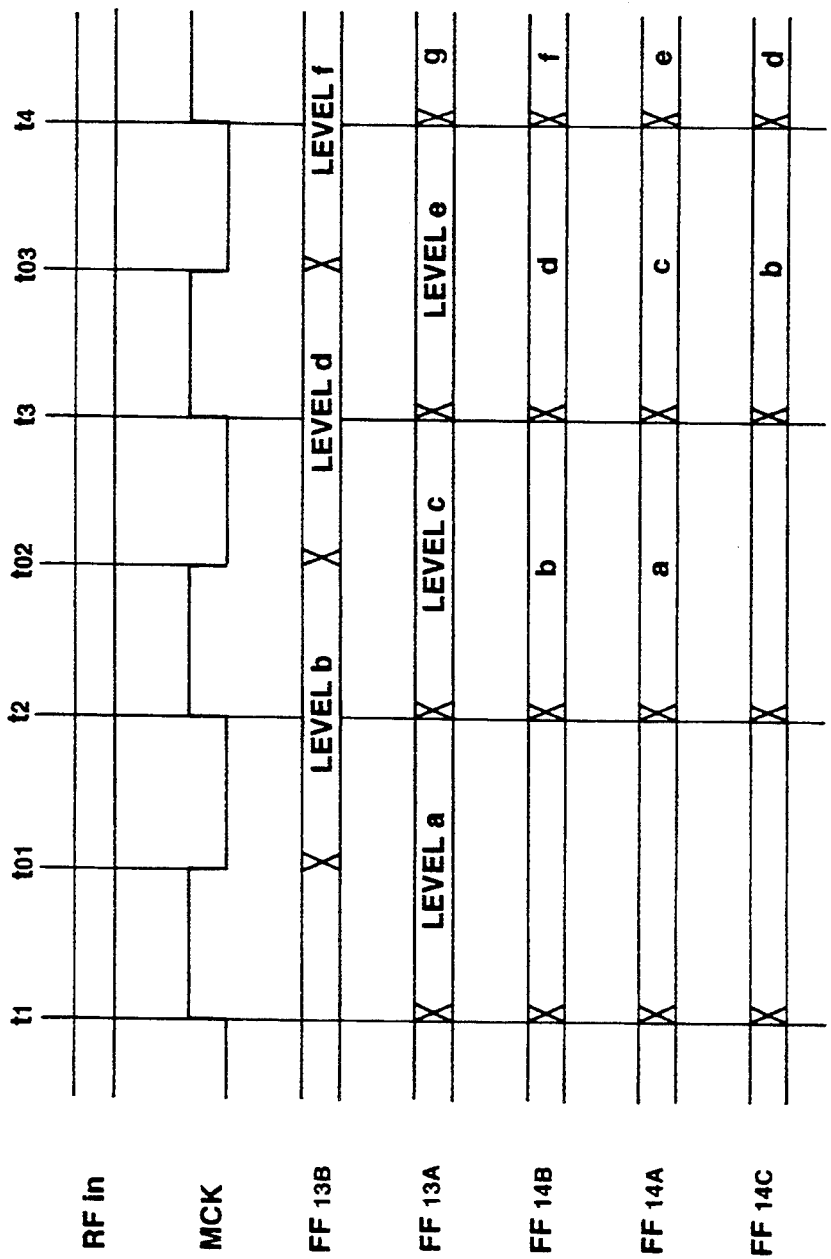
FIG. 18 is a timing chart for illustrating the operation of the circuit shown in FIG. 17.

In Figs. 17 and 18, there are shown four EX-OR circuits 91 to 94, of which the EX-OR circuit 93 corresponds to the EX-OR circuit 15A shown in FIG. 15 and the EX-OR circuit 92 corresponds to the EX-OR circuit 15B shown in FIG. 15. The previous and succeeding edges are seen on the basis of the half periods of the master clock (TMC/2). AND gate 95 ANDs the negation of the output of the EX-OR circuit 91, an output of EX-OR circuit 92 and the negation of an output of the EX-OR circuit 93 to detect an input edge within a time domain corresponding to "H" of the master clock MCK, while AND gate 96 ANDs the negation of the output of the EX-OR circuit 92, an output of EX-OR circuit 93 and the negation of an output of the EX-OR circuit 94 to detect an input edge within a time domain corresponding to "L" of the master clock MCK. In this manner, the edge detection signal ED is outputted only when there is no edge during time domains before and after the one-half period wherein the input edge has occurred.

The ring delay selection circuit 34 shown in FIG. 15 is hereinafter explained.

If the ring oscillator 30 is applied to a digital PLL, it becomes possible to measure the optimum input edge time detection, so that master clocks of a lower frequency may be employed, as mentioned above. However, the ring oscillator makes use of the inverter delay which is changed significantly with fluctuations in the semiconductor manufacture process, voltages of the power sources or the temperatures employed. Besides, if the Fate of the digital signal entered at the PLL is changed, changes in the reproducing clocks cannot be coped with by changes in the center frequency of the circuit without increasing the circuitry significantly. Therefore, it is desirable to change the master clocks at a Fate comparable to that of the reproducing clocks. The ratio Of Fate change of the digital signals entered at PLL is assumed to be on the order of 1 : 8, with the ratio of the change of the master clock frequency being desirably on the order 1 : 4.

In such system in which inverter delay or master clock periods TMC are not constant, it is not practical to have a short gate delay which will provide a sufficient resolution for a short master clock period TMC or to have a long period in which the ring oscillator does not make the round within a master clock period TMC in case of the long master clock period TMC. In this consideration, a ring oscillator is employed which has the function of changing over the stage-by-stage delay of the ring oscillator which may be changed over stepwise is employed, and such stage-by-stage delay is selected which becomes the least within the range in which the ring oscillator does not make the round within the master clock period TMC.

Such automatic switching or selection of the delay of the ring oscillator is hereinafter explained by referring to FIGS. 19 to 21.

Figure 19:
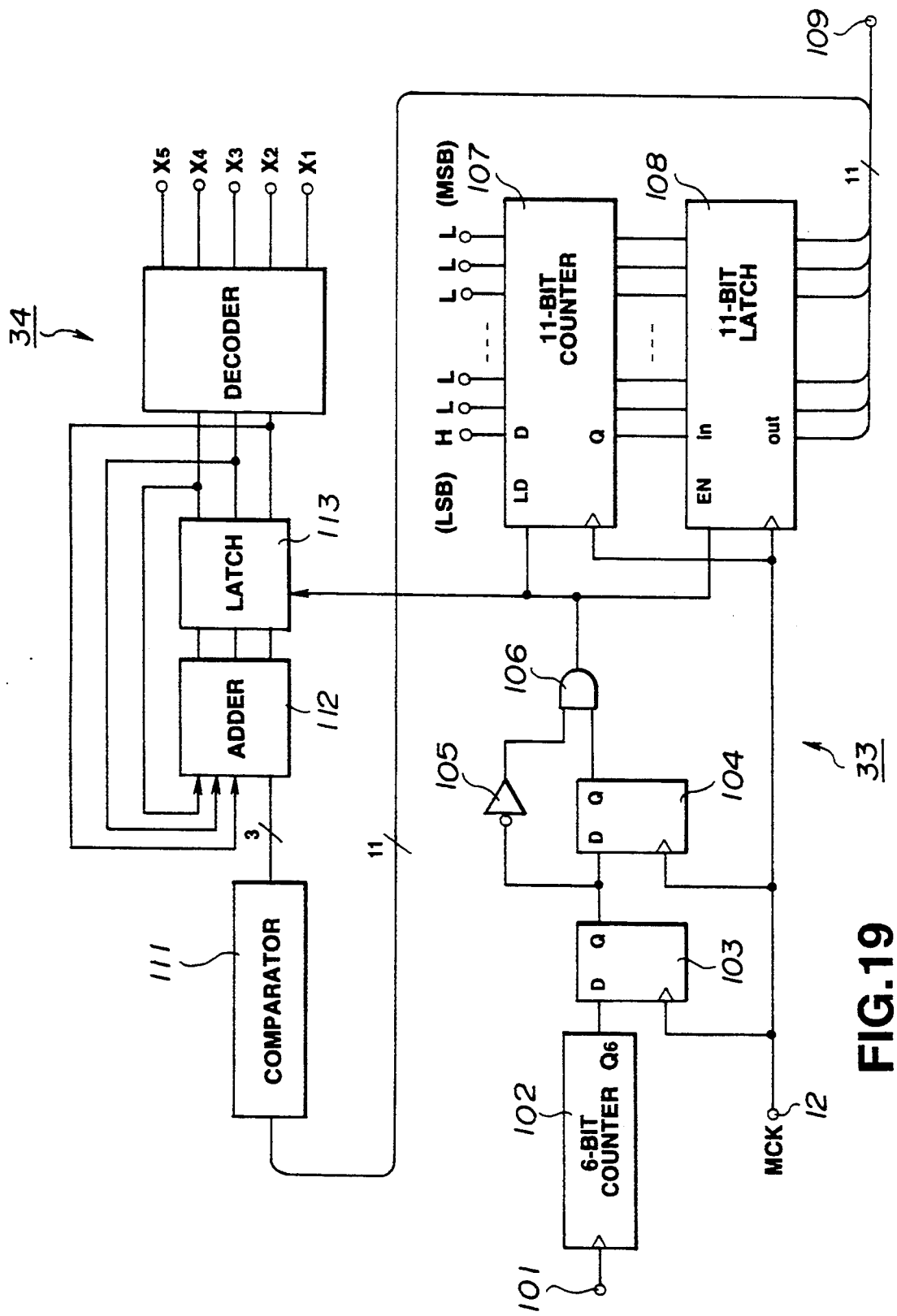
FIG. 19 is a block circuit diagram for illustrating an exemplary ring delay time measurement circuit and an exemplary ring delay selection circuit shown in FIG. 15.

FIG. 19 shows, in a block circuit diagram, a concrete example of the ring delay time measurement circuit 33 and the ring delay selection circuit 34 shown in FIG. 15. In FIG. 19, an output signal of an optional inverter of the ring oscillator 30 shown in FIG. 15 is supplied to an input terminal 101 of the ring delay time measurement circuit 33. A 11-bit measurement output of an output terminal 109 is supplied to a multiplier 36 shown in FIG. 15. FIG. 20 shows a concrete typical construction of the ring oscillator 30'' in which the delay time may be selectively controlled by the ring delay selecting circuit 34 shown in FIG. 19. FIG. 21 shows a concrete example of an inverter which may be employed in the ring oscillator 30''.

The ring delay time measurement circuit 33 measures the period TRN of the ring oscillator operation based on the master clock period TMC. The waveform to be measured is an output waveform of one of inverters of the ring oscillator. However, if one waveform (one period) is measured, sufficient accuracy cannot be achieved. Therefore, a number of waveforms (periods) are measured and divided by the number of the waveforms to find a waveform (period). In effect, the time duration of a 2N number of waveforms, N being a natural number, is measured, and shifted by N bits to find the value equal to 1/2N times the 2N waveform time duration. In the example of FIG. 19, N is set to 6, and measurement is made of the number of master clocks contained in the 64 waveforms.

Referring to FIG. 19; an output signal of an arbitrary inverter of the ring oscillator, supplied via terminal 101, is supplied to e.g. a 6-bit counter 102. The MSB output or so-called Q6 is supplied to and latched by flip-flop 103 so as to be differentiated by flip-flop 104, inverter 105 and AND gate 106 to detect a decay edge. The master clock MCK is employed as the clock for each of the flip-flops 104 and 103.

An output signal of the AND gate 106 has a pulse period of 64 TRN equal to 64 times the ring oscillator output TRN, with the pulse width being one master clock period TMC. This output signal is transmitted to a load terminal of a 11-bit counter 107 and to an enable terminal of the 11-bit latch circuit 108 to find the number of the master clocks -MCK within the time of 64 TRN. More specifically, data "1" is loaded in the 11-bit counter 107 by an output pulse from AND gate 106, that is, the 11-bit counter is set to an initial value of "1", and a value directly before resetting is captured in a latch circuit 108. If the interval between the 6th and 7th bits is deemed to be a binary point, the decimal point of the 11-bit integer output is shifted to an upper order side by 6 bits, meaning that the data is multiplied by 1/64. This is tantamount to measuring the period TRN of one complete rotation of the ring oscillator with an accuracy equal to 1/64th of the master clock period TMC.

The ring delay selection circuit 34 plays the role of selecting the delay quantity of the ring oscillator to an adequate value. For example, if the measured value at the ring delay time measurement circuit 33 is 1 or less, the ring oscillator performs one complete rotation or more than one complete rotation within one master clock period TMC. Therefore, it is necessary to select the delay quantity so as to be larger by one rank. It is preferred to perform switching with certain allowance in such a manner that the delay quantity is switched to a value larger by one rank when the measured value is lesser than a predetermined lower limit value k MIN of the order of 1.2 even although the measured value does not reach unity (1). If the measured value is excessively large, meaning that the period of one ring oscillator rotation TRN is unnecessarily large, the unit time run, obtained on dividing the period TRN by the number of the ring oscillator stages becomes larger to lower the measurement accuracy, that is the resolution within the master clock period TMC. Therefore, it is desirable that the delay quantity be switched to a value one rank lower when a preset upper limit value k MAX is exceeded.

In the ring delay selection circuit 34, a measured output value from latch circuit 108 is compared by comparator 111 to a lower limit value k MIN on the order of 1.2 and an upper limit value k MAX on the order of 2. If the measured output value is within the range confined between the limit values k MIN and k MAX, "0" is supplied to adder 112. If the measured output value is smaller than the lower limit value k MIN or larger than the upper limit value k MAX, "+1" or "−1" are transmitted to AND gate 112, respectively. An addition output of adder 112 is supplied to a latch circuit 113, to an enable terminal of which a pulse output of the 64 TRN period pulse output from AND gate 106 is supplied, while an output of latch circuit 113 is supplied to the adder 112 and decoder 114. Decoder 114 decodes an output of latch circuit 113 with e.g. five signals X1 to X5 and outputs the decoded output.

Figure 20:
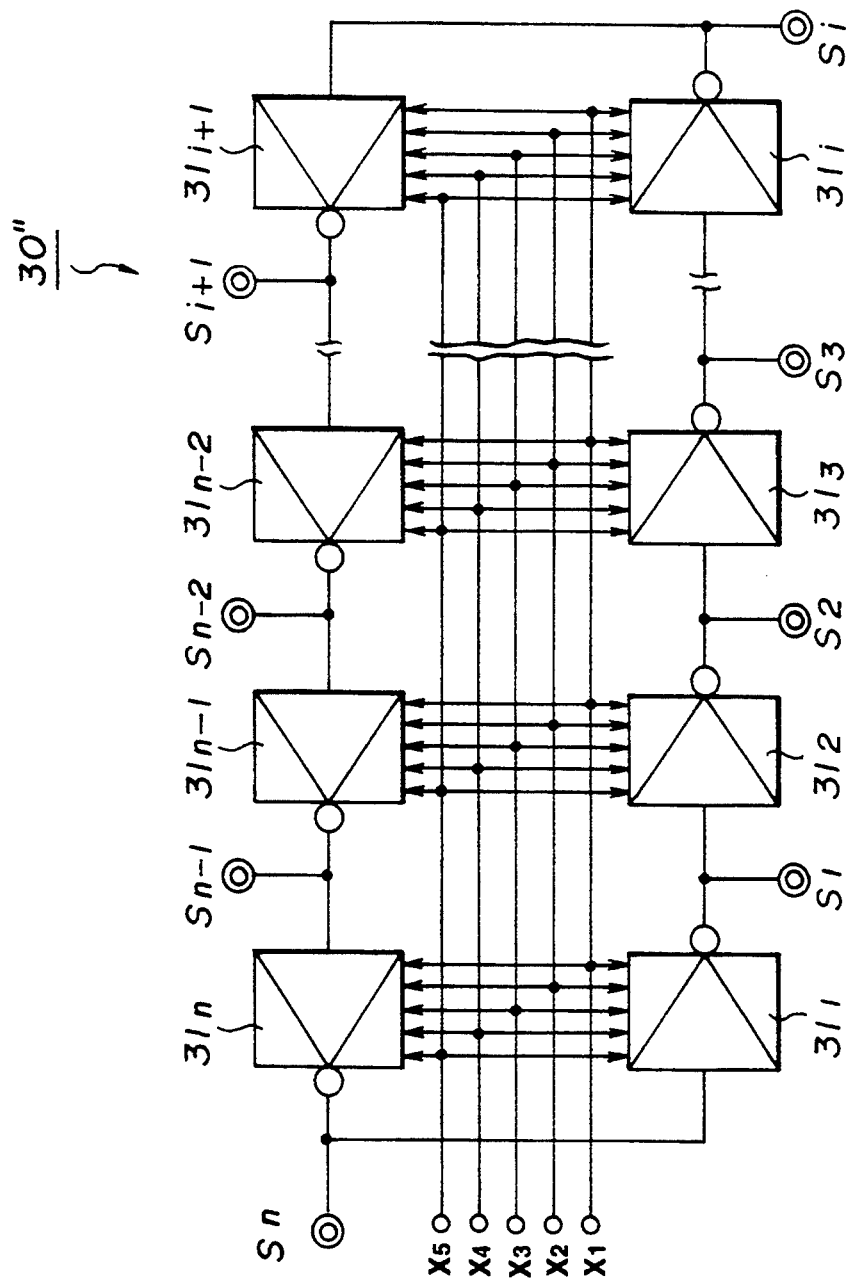
FIG. 20 is a block circuit diagram showing an embodiment of a ring oscillator having delay times selectable by switching.

FIG. 20 shows an example of a ring oscillator 30'' the delay quantity of which is controlled by switching by signals X1 to X5. An n number of inverter circuits 311 to 31n, n being an odd number, are connected in a ring, and output signals are taken out at respective junction points. These inverter circuits 311 to 31n have their delay time durations switched in five stages by signals X1 to X5 from the ring delay selection circuit 34 shown in FIG. 19. FIG. 21 shows a concrete example of the inverter circuit 31 the delay time of which may be switched in five stages.

Figure 21:
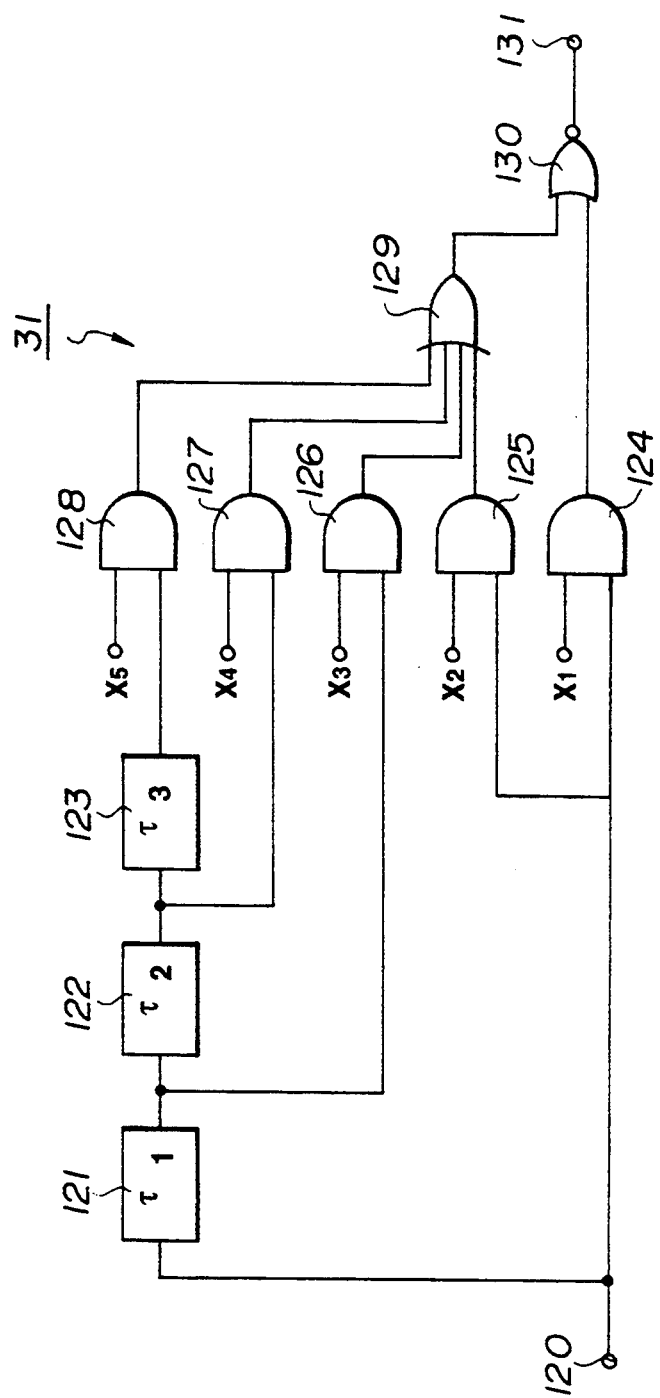
FIG. 21 is a circuit diagram showing an embodiment of an inverter employed in the ring oscillator having delay times selectable by switching.

An input terminal 120 of the inverter circuit 31 of FIG. 21 is connected to an end of a series circuit of delay elements 121, 122 and 123 having delay times of τ1, τ2 and τ3, respectively, while being connected to AND gates 124 and 125.

The delay elements 121, 122 and 123 have their output terminals connected to AND gates 126, 127 and 128, respectively. The AND gates 124 to 128 are supplied with signals X1 to X5, respectively, and one of the AND gates is rendered conductive when an associated one of the signals X1 to X5 goes high "H". Outputs of AND gates 125 to 128 are supplied via OR gate 129 to a NOR gate 130, while an output of AND gate 124 is transmitted to a NOR gate 130. An output of NOR gate 130 is taken out at a terminal 131 as an output of the inverter circuit 31.

If, with the delay time of the AND gates 124 to 128 equal to one another and equal to AND, the delay time of OR gate 129 equal to τOR and with the delay time of NOR gate 130 equal to τNOR, in the arrangement of FIG. 21, the signal X1 is selected to render the output of the inverter circuit 31 high "1", the delay time τX1 of inverter circuit 31 is given by $$\tau X1 = \tau AND + \tau NOR$$

Similarly, when the signals X2, X3, X4 and X5 are selected so that the output of the inverter circuit goes high, that is becomes equal to "1", delays τX2, τX3, τX4 and τX5 of the inverter circuit 31 are given by $$\tau X2 = \tau AND + \tau OR + \tau NOR$$

$$\tau X3 = \tau1 + \tau AND + \tau OR + \tau NOR$$

$$\tau X4 = \tau 1 \tau 2 + \tau AND + \tau OR + NOR$$

$$\tau X5 = \tau 1 + \tau 2 + \tau 3 + \tau AND + \tau OR + \tau NOR$$

Therefore, the delays are increased each time signals X1, X2, X3, X4 and X5 are selected in this order.

In setting the delays $\tau X1$ to $\tau X5$, which may be selected by switching in this manner, it is preferred too set the ratios between neighboring delays, such as $\tau X2/\tau x1$, $\tau X3/\tau X2$, etc. to a value less than a predetermined value R. As to the switching conditions of the ring delay time, if assumed that, the delay is increased or decreased one step when the above-mentioned value (normalized based on the master clock period TMC set to unity) is not more than the lower limit k MIN or when the value is larger than the upper limit, k MAX, respectively, the relation k MAX / k MIN > R needs to be satisfied.

If, with the above relations not being satisfied, R=2, k MIN=1.2 and k MAX=2.0, the delay time is increased by one step when the measured output of the ring delay from the time of selection of X1 becomes smaller than the lower limit k FIIN =1.2 but extremely close to 1.2, X2 is selected, however, the measured output of the ring delay time becomes slightly smaller than 2.4. Since this is larger than the upper limit k MAX =2.0, switching control of decreasing the delay by one step is performed automatically, so that the measured output again becomes slightly smaller than the lower limit value of k MIN =1.2 and close to 1.2. The above-mentioned operation is performed repeatedly. That is, the delay switching operation becomes unstable. The above accounts for the necessity of satisfying the relation kAX k MIN>R.

It is seen from above that, by automatically switching the ring oscillator delay time, the normal PLL operation may be maintained despite fluctuations in semiconductors or fluctuations in the device delay due .to changes in temperature or source voltage to permit designing for mass production of LSIs. In applications to PLL, changes in input signal rate to PLL may be coped with by changing the master clocks to simplify circuit constructions.

In general, PLL has an advantage that the larger the loop gain, the more sensitive PLL is to cause the reproducing clock phase to be changed significantly in the direction of coinciding the reproducing clock phase with input data by the detected phase error, so that the time until locking is shorter and pseudo locking is scarcely incurred. However, if, after locking is achieved, the loop gain becomes larger, considerable phase changes are produced by a smaller disturbance, so that the PLL is unstable and an error due to bit shift in the reproduced signal is increased. The result is that the value of loop gain is a compromise between the performance until locking and that. after locking.

IT may be contemplated to variably control the ratio of the phase error transmitted to the reproducing clock oscillator, or so-called loop gain to control the loop gain depending on whether the PLL is in a phase locked state.

Figure 22:
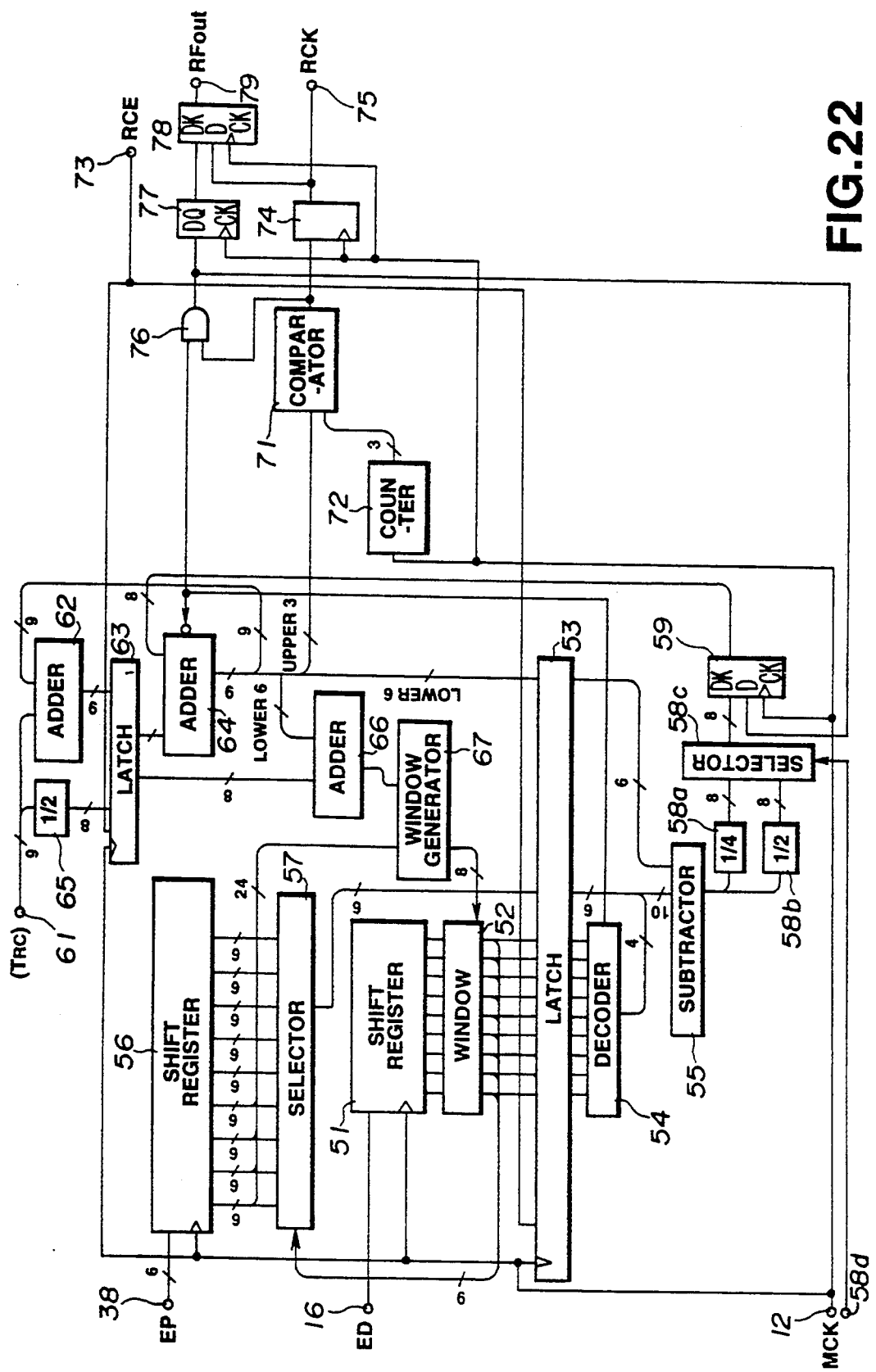
FIG. 22 is a schematic block circuit diagram showing a phase synchronizing circuit in which a loop gain switching control means is annexed to the digital PLL circuit according to the present invention.

Referring to FIG. 22, an edge position error signal from subtractor 55 is transmitted to a ½attenuator 58a and ½attenuator 58b, attenuated outputs of which are transmitted to a selector 58c, which is switchingly controlled by a phase lock discrimination signal (PLL locking signal) from terminal 58d. A signal from ½attenuator 58a and a signal from ½attenuator 58b are selected for PLL locking and PLL capturing, respectively, and the selected signal is supplied to a flip-flop circuit 59. The construction and operation is otherwise the same as that of FIG. 7 described above. For example, an output of flip-flop circuit 59 is transmitted as a phase error correction quantity to an adder 64 of a reproducing clock oscillator composed of an adder 62 and a latch circuit 63, besides the adder 64.

A selector control signal at terminal 58d is a 1-bit phase lock discriminating signal indicating whether or not the reproducing clock produced by the PLL is synchronized with an input signal. A smaller edge error quantity is selected during locking to realize a PLL operation which is strong against disturbance and less susceptible to locking and which exhibits a low error rate and stable PLL operation. Conversely, a larger edge quantity is selected during an asynchronous operation (capturing) to realize an operation in which the time until locking is shorter and quick capturing is realized with the least risk of pseudo locking. The smaller edge error is obtained e.g. from the ½attenuator while the larger edge error quantity is obtained e.g. from ½attenuator 58b. Setting the error quantity to powers of 2 is convenient in that simple bit shifting suffices.

Figure 23:
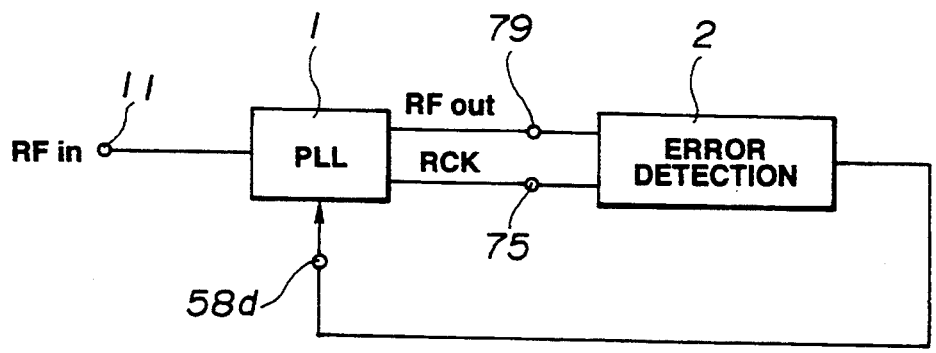
FIG. 23 illustrates a PLL lock decision signal.

Referring to FIG. 23, a concrete example of finding the phase locking discriminating signal (PLL locking signal ) is explained in detail.

It is a common practice that the input signal RF in, from which clocks are extracted, is a digital signal and contains some information, and that an error correction code is appended to the signal to enable error detection and correction to permit the information to be reproduced correctly. If the PLL circuit 1 is in the locked state and correct clocks synchronized with the playback data are reproduced, the playback data entered into the error detection circuit 2 for each clock input is judged to be reproduced with a certain high probability. For example, the error rate of digital devices for civil use on the playback bit basis is not higher than $10^{-6}$.

Conversely if the PLL circuit 1 is not locked, the playback data is such that clocks are not associated on the bit-by-bit basis, such errors as bit dropout or bit shift in which 1 bit is deemed to be 2 bits are produced. Since parity data are produced in the error correction code with a block of tens to hundreds of bits (so-called error correction block), a given block is free of error if the totality of bits of the block are correct. If the PLL is not in locked state, a block free of errors can hardly exist. therefore, the locked state of PLL may be discriminated by setting a suitable threshold such that the PLL is assumed to be locked when there are error-free block at rate of 2 per 100 blocks. It suffices to transmit the results of decision produced responsive to the error state in the error detection circuit 2 as the above-mentioned phase lock discrimination signal (PLL locking signal) to terminal 58d of the PLL circuit 1.

It is to be noted that the present invention is not limited to the above-described embodiments which are given only by way of illustration. For example, the number of bits (stages one elements) of the ring oscillator, the number of bits of the ring delay time measurement output, numbers of bits or steps of the shift register or latch circuits for capturing the edge position signal or edge detection signal and other data are not limited to those given in the above-described embodiments.

What is claimed is:

1. An input signal edge time measurement circuit comprising
   a ring oscillator having an odd number of inverters connected in a ring,
   means for detecting an edge of an input signal,
   first latch means for capturing first states of various respective stages of said ring oscillator at a timing of a detected edge of said input signal,
   second latch means for capturing second states of said respective stages of said ring oscillator at the a timing of a master clock, and
   edge position calculating means for comparing said first states of said respective stages of said ring oscillator captured by said first latch means and said second states of said respective stages of said ring oscillator captured by said second latch means and outputting a difference between these states as an edge position detection signal.

2. The input signal edge time measurement circuit as claimed in claim 1 wherein said edge position calculating means comprise third latch means for capturing an output of said first latch means at a rise timing of said master clock and a fourth latch means for capturing an output of said first latch means at a decay timing of said master clock, and wherein an output of said third latch means and an output of said fourth latch means are selected when the edge of said input signal is in a high level domain of said master clock and in a low level domain of said master clock, respectively, and one of the output of said third latch means and the output of said fourth latch means thus selected is compared to an output of said second latch means.

3. The input signal edge time measurement circuit as claimed in claim 1 wherein said ring oscillator comprises inverter elements with variable delay and wherein said delay is switchingly selected responsive to ratio of period of oscillation of said ring oscillator to a period of said master clock.

4. An input signal time measurement circuit comprising
   a ring oscillator having an odd number of inverters connected in a ring,
   a first edge detecting means for detecting an edge of input signals,
   first latch means for capturing first states of various respective stages of said ring oscillator at a timing of said detected edge of an input signal,
   second latch means for capturing second states of said respective stages of said ring oscillator at a timing of a master clock,
   edge position calculating means for comparing said first states of said respective stages of said ring oscillator captured by said first latch means and said second states of said respective stages of said ring oscillator captured by said second latch means and outputting a difference between these states as an edge position detection signal,
   a second edge detecting means for sampling said input signal with said master clock and detecting an input signal edge within a period of said master clock as a basis for outputting an edge detection signal,
   reproducing clock generating means for outputting a reproducing clock based on phase error data and reproducing clock period data,
   phase error detection means for finding phase error data between a reproducing clock edge and said input signal edge based on said edge position detection signal from said position calculating means and said edge detection signal from said second edge detecting means and transmitting said phase error data to said reproducing clock generating means, and
   reproducing clock period detection means for detecting period data of said reproducing clock from said reproducing clock generating means and transmitting said period data to said reproducing clock generating means.

5. The input signal edge time measurement circuit as claimed in claim 4 wherein said edge position calculating means comprise third latch means for capturing an output of said first latch means at a rise timing of said master clock and a fourth latch means for capturing an output of said first latch means at a decay timing of said master clock, and wherein an output of said third latch means and an output of said fourth latch means are selected when the edge of said input signal is in a high level domain of said master clock and in a low level domain of said master clock, respectively, and the output thus selected is compared to an output of said second latch means.

6. The input signal edge time measurement circuit as claimed in claim 4 wherein said ring oscillator comprises inverter elements with variable delay and wherein said delay is switchingly selected responsive to a ratio of a period of oscillation of said ring oscillator to a period of said master clock.

7. A digital PLL circuit supplied with an edge detection signal obtained by detecting an edge of an input signal using a master clock and with an edge position signal indicating a position of said input edge relative to said master clock, comprising
   a first shift register for storing said edge detection signal,
   a window circuit for limiting an output of said first shift register to a number of bits corresponding to one period of a reproducing clock,
   a first latch circuit for capturing bits passed through said window circuit,
   edge bit position detection means for detecting a presence of said input edge and a corresponding bit position thereof relative to said bits captured by said first latch circuit,
   a second shift register for storing said edge position signal,
   a selector for selecting an output of said second shift register by using said edge detection signal,
   a second latch circuit for capturing an output of said selector, and
   means for subtracting a value corresponding to a zero phase error edge position from a combined output of an output of said edge bit position detection means and an output of said second latch circuit.

8. The digital PLL circuit as claimed in claim 7 further comprising
   a window generating circuit for calculating a window width of said window circuit, including a boundary determinator for calculating a window boundary at an intra-bit position of a bit of said first shift register which is closest to an input side of said first shift register and producing an output for selecting an output of said second shift register corresponding to said bit closest to said input side of said first shift register, a comparator for comparing said output of said second shift register and said intra-bit position of said window boundary, and a circuit for decoding from a result of comparison whether or not said bit closest to said input side of said first shift register is in the window and producing an output for controlling said window circuit.

9. A digital PLL circuit supplied with an edge detection signal obtained on detecting an edge of an input signal using a master clock and with an edge position signal indicating the position of said input edge relative to said master clock, comprising a first shift register for storing said edge detection signal, a window circuit for limiting an output of said first shift register to a number of bits corresponding to one period of a reproducing clock, a window generating circuit for calculating a window width of said window circuit, and a second shift register for storing said edge position signal, wherein said window generating circuit includes a boundary determinator for calculating a window boundary at an intra-bit position of a bit of said first shift register which is closest to an input side of said first shift register and producing an output for selecting an output of said second shift register corresponding to said bit closest to said input side of said first shift register, a comparator for comparing said output of said second shift register and said intra-bit position of said window boundary and a circuit for deciding from a result of comparison whether or not said bit closest to said input side of said first shift register in the window and producing an output for controlling said window circuit.

* * * * *

UNITED STATES PATENT AND TRADEMARK OFFICE
CERTIFICATE OF CORRECTION

PATENT NO. : 5,428,648

DATED : June 27, 1995

INVENTOR(S) : Shinichi Fukuda

It is certified that error appears in the above-identified patent and that said Letters Patent is hereby corrected as shown below:

```
Col. 1, line 16, change "voltage-control led" to --voltage-controlled--.
        line 35, change "desirable ." to --desirable.--
        line 44, after "constraints" insert --,--
        line 46, change "Of" to --of--
        line 52, after "of" second occurrence, insert --a--
        line 60, change "the" to --a--
        line 61, after "the" first occurrence, insert --sum of--
Col. 3, line 6, change "he" to --the--
Col. 5, line 48, change "TRN10т0" to --TRN=10т0--
        line 60, after "d," insert --a--
        line 63, change "A1" to --S1--
Col. 6, line 24, change "EXit" to --EX15--
        line 25, change "EXIT" to --EX15--
        line 31, after "of" insert --15--
        line 36, after "the" first occurrence, insert --15--
        line 40, change "OF" to --or
        line 46, change "SO" to --so--
        line 51, change "RF27" to --FF27--
        line 57, change "SO" to --so--
Col. 7, line 23, after ""2"" insert --.--
        line 42, change "run" to --ʈun--
        line 59, after "figure," insert --a--
        line 63, change "OF" to --or--
        line 67, after "to" insert --an--
```

UNITED STATES PATENT AND TRADEMARK OFFICE
CERTIFICATE OF CORRECTION

PATENT NO. : 5,428,648

DATED : June 27, 1995

INVENTOR(S) : Shinichi Fukuda

It is certified that error appears in the above-identified patent and that said Letters Patent is hereby corrected as shown below:

```
Col. 8, line 6, change "k+1:1 if k 7" to --k+1=1 if k=7--
        line 26, change "OR" to --AND--
        line 42, change "Of" to --of--
        line 47, change "Fun" to --run--
        line 60, change "Of" to --or--
        line 66, change "∿" to --∼--
Col. 9, line 28, after "above" insert -----
        line 30, change "OF" to --or--
Col. 10, line 25, change "Upper" to --upper--
        line 29, change "171" to --71--
        line 30, after "71," insert --a--
        line 33, after "circuit" second occurrence, insert --63--
        line 40, after "78" delete "."
        line 47, change "OF" to --or--
        line 65, change "the" to --The--
Col. 11, line 1, after "parallel" delete "-"
        line 13, delete "," first occurrence and second occurrence
        line 14, change "select, or" to --selector--
        same line, after "6-bit" delete ","
        same line, change "select, or" to --selector--
        line 17, change "shift,ed at, a 1-bit," to --shifted at a 1-bit--
        line 18, change "pre-determined" to --predetermined--
        same line, delete "," second occurrence
        line 22, change "posit,ion" to --position--
        line 27, delete "," first occurrence
        line 32, change "represent, ed" to --represented--
        line 35, delete ","
        line 37, delete "," second occurrence
        line 52, change "6" to --9--
        line 63, change "1"round" to --found--
```

UNITED STATES PATENT AND TRADEMARK OFFICE
CERTIFICATE OF CORRECTION

PATENT NO. : 5,428,648

DATED : June 27, 1995

INVENTOR(S) : Shinichi Fukuda

It is certified that error appears in the above-identified patent and that said Letters Patent is hereby corrected as shown below:

```
Col. 12, line 1, delete ","
        line 13, after "54" insert --,--
        line 25, change "OF" to --of--
        line 41, delete ";"
        line 50, delete ","
        line 64, change "run" to --run--
Col. 13, line 23, change "Upper to --upper--
        line 28, change "OF" to --or--
        line 36, change "OF" to --or--, both occurrences
        line 38, delete "69f"
        same line, change "69C" to --69c--
        line 45, change "W1 to W4" to --w1 to w4--
        line 46, change "1time" to --time--
        line 49, delete ":"
        line 50, delete "of"
        line 51, delete "," first occurrence and second occurrence
        line 52, change "temporarily" to --temporally--
        line 57, delete ","
        line 58, change "1she" to --the-
        line 61, delete "," first and second occurrences
        line 66, delete ","
        line 67, delete ","
Col. 14, line 2, delete "," second occurrence
        line 3, delete ","
        line 4, delete "," first occurrence
        line 23, change ",is" to --, is--
        line 67, change "control 11rig" to --controlling--
```

UNITED STATES PATENT AND TRADEMARK OFFICE
CERTIFICATE OF CORRECTION

PATENT NO. : 5,428,648
DATED : June 27, 1995
INVENTOR(S) : Shinichi Fukuda

It is certified that error appears in the above-identified patent and that said Letters Patent is hereby corrected as shown below:

```
Col. 15, line 10, change "above mentioned" to --above-mentioned--
        line 26, change "NCK" to --MCK--
        line 33, delete "," first and second occurrences
        line 38, after "or" delete "-"
        line 43, change "select, or" to --selector--
        line 44, after "bit" delete "."
        same line, delete ","
        line 45, delete "," first occurrence
        line 63, change "Upper" to --upper--
Col. 16, line 22, change "-inputs" to --inputs--
        line 30, change "A" to --a--
        same line, after "and" insert --c--
Col. 18, line 36, change "Fate" to --rate--
        line 41, change "Fate" to --rate--
        line 42, change "Of Fate" to --of rate--
Col. 19, line 24, change ";" to --,--
        line 38, after "clocks" delete "-"
        line 65, change "run" to --τun--
Col. 20, line 50, change "AND" to --τAND--
        line 62, delete "τX3"
Col. 21, line 2, change "τ1τ2" to --τ1+τ2--
        same line, change "NOR" to --τNOR--
        line 11, change "too" to --to--
        line 15, delete "," second occurrence
        line 19, delete "," first occurrence
        line 22, change "relations" to --relation--
        line 26, change "FIIN" to --MIN--
        line 37, change "kAX k" to --k MAX/k--
        line 41, after "due" delete "."
        line 59, after "that" delete "."
        line 60, change "IT" to --It--
        line 66, change "¼attenuator" to --¼ attenuator--
        line 67, change "½attenuator" to --½ attenuator--
```

UNITED STATES PATENT AND TRADEMARK OFFICE
CERTIFICATE OF CORRECTION

PATENT NO. : 5,428,648
DATED : June 27, 1995
INVENTOR(S) : Shinichi Fukuda It is certified that error appears in the above-identified patent and that said Letters Patent is hereby corrected as shown below:

Col. 22, line 1, change "trol led" to --trolled--
    line 2, change "$\frac{1}{4}$at-" to --$\frac{1}{4}$ at---
    line 3, change "$\frac{1}{2}$attenuator" to --$\frac{1}{2}$ attenuator--
    line 24, change "$\frac{1}{4}$attenuator" to --$\frac{1}{4}$ attenuator--
    line 26, change "$\frac{1}{2}$attenuator" to --$\frac{1}{2}$ attenuator--
    line 52, change "therefore" to --Therefore--

In the claims:

Col. 23, line 13, delete "the"
    line 40, change "ratio of" to --a ratio of a--
Col. 24, line 4, after "said" insert --edge--
Col. 26, line 17, after "register" insert --is--

Signed and Sealed this

Third Day of December, 1996

Attest:

BRUCE LEHMAN

Attesting Officer     Commissioner of Patents and Trademarks